US012642145B2

(12) United States Patent (10) Patent No.: US 12,642,145 B2

Choi et al. (45) Date of Patent: May 26, 2026

(54) SEMICONDUCTOR PACKAGE

(71) Applicant: SAMSUNG ELECTRONICS CO., LTD., Suwon-si (KR)

(72) Inventors: Hwanyoung Choi, Suwon-si (KR); Seokhyun Lee, Suwon-si (KR); Seokgeun Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 18/373,405

(22) Filed: Sep. 27, 2023

(65) Prior Publication Data

US 2024/0170440 A1 May 23, 2024

(30) Foreign Application Priority Data

Nov. 18, 2022 (KR) ........................ 10-2022-0155536

(51) Int. Cl.
H01L 23/00 (2006.01)
H01L 25/065 (2023.01)

(52) U.S. Cl.
CPC .............. H01L 24/33 (2013.01); H01L 24/16 (2013.01); H01L 24/32 (2013.01); H01L 24/73 (2013.01); H01L 25/0657 (2013.01); *H01L 2224/16148* (2013.01); *H01L 2224/16225* (2013.01); *H01L 2224/32059* (2013.01); *H01L 2224/32145* (2013.01); *H01L 2224/3303* (2013.01); *H01L 2224/73204* (2013.01); (Continued)

(58) Field of Classification Search
CPC ......... H01L 24/33; H01L 24/16; H01L 24/32; H01L 24/73; H01L 25/0657; H01L 2224/16148; H01L 2224/16225; H01L 2224/32059; H01L 2224/32145; H01L 2224/3303; H01L 2224/73204; H01L 2225/06513; H01L 2225/06541; H01L 2924/2064; H01L 24/83; H01L 2225/06565; H01L 24/13; H01L 24/05; H01L 25/50; H01L 2225/06517; H01L 23/3185; H01L 25/18

See application file for complete search history.

(56) References Cited

U.S. PATENT DOCUMENTS

| | | |
|---|---|---|
| 11,217,540 B2 | 1/2022 | Kim |
| 2017/0186719 A1 | 6/2017 | Kira et al. |

(Continued)

*Primary Examiner* — Elias Ullah

(74) *Attorney, Agent, or Firm* — Morgan, Lewis & Bockius LLP

(57) ABSTRACT

A semiconductor package includes first semiconductor chips electrically connected to each other through a through-via electrically connecting a first front surface pad and a first rear surface pad. A second semiconductor chip has a second lower surface including a second front surface pad, a second upper surface, a second side surface extending from the second upper surface, and a recess surface extending from the second lower surface to the second side surface. First adhesive films are on a first lower surface of first semiconductor chips and include first extension portions extending further outwardly than a first side surface of the first semiconductor chips. A second adhesive film is on the second lower surface and includes a second extension portion extending further outwardly than the second side surface. In a horizontal direction, a length of the second extension portion is less than a length of each of the first extension portions.

20 Claims, 14 Drawing Sheets

(52) U.S. Cl.
CPC ............... *H01L 2225/06513* (2013.01); *H01L 2225/06541* (2013.01); *H01L 2924/2064* (2013.01)

(56) References Cited

U.S. PATENT DOCUMENTS

2019/0243708 A1    8/2019   Cha et al.
2021/0143008 A1    5/2021   Ko et al.

1000A

300    RS(R2)    600(603)    400

<u>A</u>

1000a

1000E

II-II'

SEMICONDUCTOR PACKAGE

CROSS-REFERENCE TO RELATED APPLICATION(S)

This application claims benefit under 35 U.S.C. § 119 to Korean Patent Application No. 10-2022-0155536, filed on Nov. 18, 2022 in the Korean Intellectual Property Office, the disclosure of which is incorporated by reference in its entirety herein.

1. TECHNICAL FIELD

The present inventive concept relates to a semiconductor package.

2. DISCUSSION OF RELATED ART

As electronic devices are becoming increasingly lightweight and exhibit a high performance, semiconductor packages that are miniaturized and high performing are being developed in the field of semiconductor packages. For example, research and development of a semiconductor package having a structure in which semiconductor chips are stacked in multiple stages is being conducted to realize miniaturization, lightweight, high performance and high reliability of a semiconductor package.

SUMMARY

An aspect of the present inventive concept is to provide a semiconductor package having increased reliability.

According to an embodiment of the present inventive concept, a semiconductor package includes a base chip. A plurality of first semiconductor chips is stacked on the base chip in a vertical direction. The plurality of first semiconductor chips having a first lower surface including a first front surface pad disposed thereon, a first upper surface opposing the first lower surface and including a first rear surface pad disposed thereon, and a first side surface extending from an edge of the first lower surface to an edge of the first upper surface. The first front surface pad and the first rear surface pad are electrically connected to each other by a through-via. A second semiconductor chip is disposed on the plurality of first semiconductor chips. The second semiconductor chip has a second lower surface including a second front surface pad disposed thereon, a second upper surface opposing the second lower surface, a second side surface extending from an edge of the second upper surface, and a recess surface extending from an edge of the second lower surface to an end of the second side surface. The second semiconductor chip is electrically connected to the plurality of first semiconductor chips and the base chip through the through-via. An encapsulant is disposed on the base chip, the encapsulant surrounding the plurality of first semiconductor chips and the second semiconductor chip. A plurality of first adhesive films is disposed on the first lower surface of each of the plurality of first semiconductor chips. The plurality of first adhesive films having first extension portions extending further outwardly than the first side surface of each of the plurality of first semiconductor chips. A second adhesive film is disposed on the second lower surface of the second semiconductor chip. The second adhesive film having a second extension portion extending further outwardly than the second side surface of the second semiconductor chip. Connection bumps are disposed below the base chip. In a horizontal direction, a length of the second extension portion is less than a length of each of the first extension portions.

According to an embodiment of the present inventive concept, a semiconductor package includes a base chip. A plurality of first semiconductor chips is stacked on the base chip in a vertical direction. A second semiconductor chip is disposed on an uppermost first semiconductor chip of the plurality of first semiconductor chips. The second semiconductor chip has a lower surface facing an upper surface of the uppermost first semiconductor chip and a recess surface extending along an edge of the lower surface. An encapsulant is disposed on the base chip. The encapsulant surrounds the plurality of first semiconductor chips and the second semiconductor chip. A plurality of first adhesive films is disposed below each of the plurality of first semiconductor chips. A second adhesive film having a central portion is disposed below the second semiconductor chip. The central portion fills a space between the upper surface of the uppermost first semiconductor chip and the lower surface of the second semiconductor chip. An edge portion fills a space between the upper surface of the uppermost first semiconductor chip and the recess surface. The edge portion only overlaps the lower surface of the second semiconductor chip in a horizontal direction.

According to an embodiment of the present inventive concept, a semiconductor package includes a base chip. At least one first semiconductor chip is disposed on the base chip. A second semiconductor chip is disposed on the at least one first semiconductor chip. The second semiconductor chip has a lower surface facing an upper surface of the at least one first semiconductor chip and a recess surface extending along an edge of the lower surface. An encapsulant is disposed on the base chip. The encapsulant surrounds the at least one first semiconductor chip and the second semiconductor chip. At least one first adhesive film is disposed below the at least one first semiconductor chip. The at least one first adhesive film has a first central portion overlapping the at least one first semiconductor chip in a vertical direction. An extension portion extends from the first central portion. The extension portion does not overlap the at least one first semiconductor chip in the vertical direction. A second adhesive film is disposed below the second semiconductor chip. The second adhesive film has a second central portion overlapping the lower surface of the second semiconductor chip in the vertical direction, and an edge portion extending from the second central portion and overlapping the recess surface of the second semiconductor chip in the vertical direction. In a horizontal direction, a first width of the first central portion is greater than a second width of the second central portion.

BRIEF DESCRIPTION OF DRAWINGS

The above and other aspects, features, and advantages of embodiments of the present inventive concept will be more clearly understood from the following detailed description, taken in conjunction with the accompanying drawings, in which.

DETAILED DESCRIPTION OF EMBODIMENTS

Hereinafter, embodiments will be described with reference to the accompanying drawings.

Figure 1A:
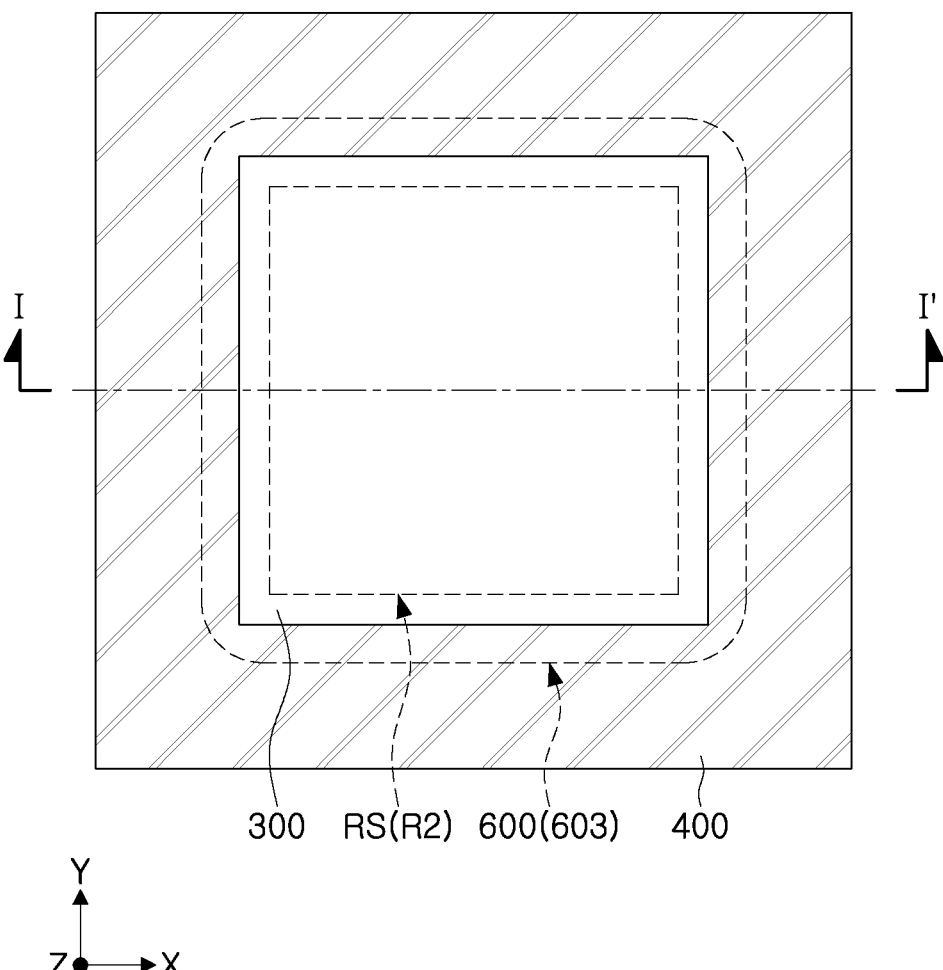
FIG. 1A is a plan view illustrating a semiconductor package according to an embodiment of the present inventive concept.
Figure 1B:
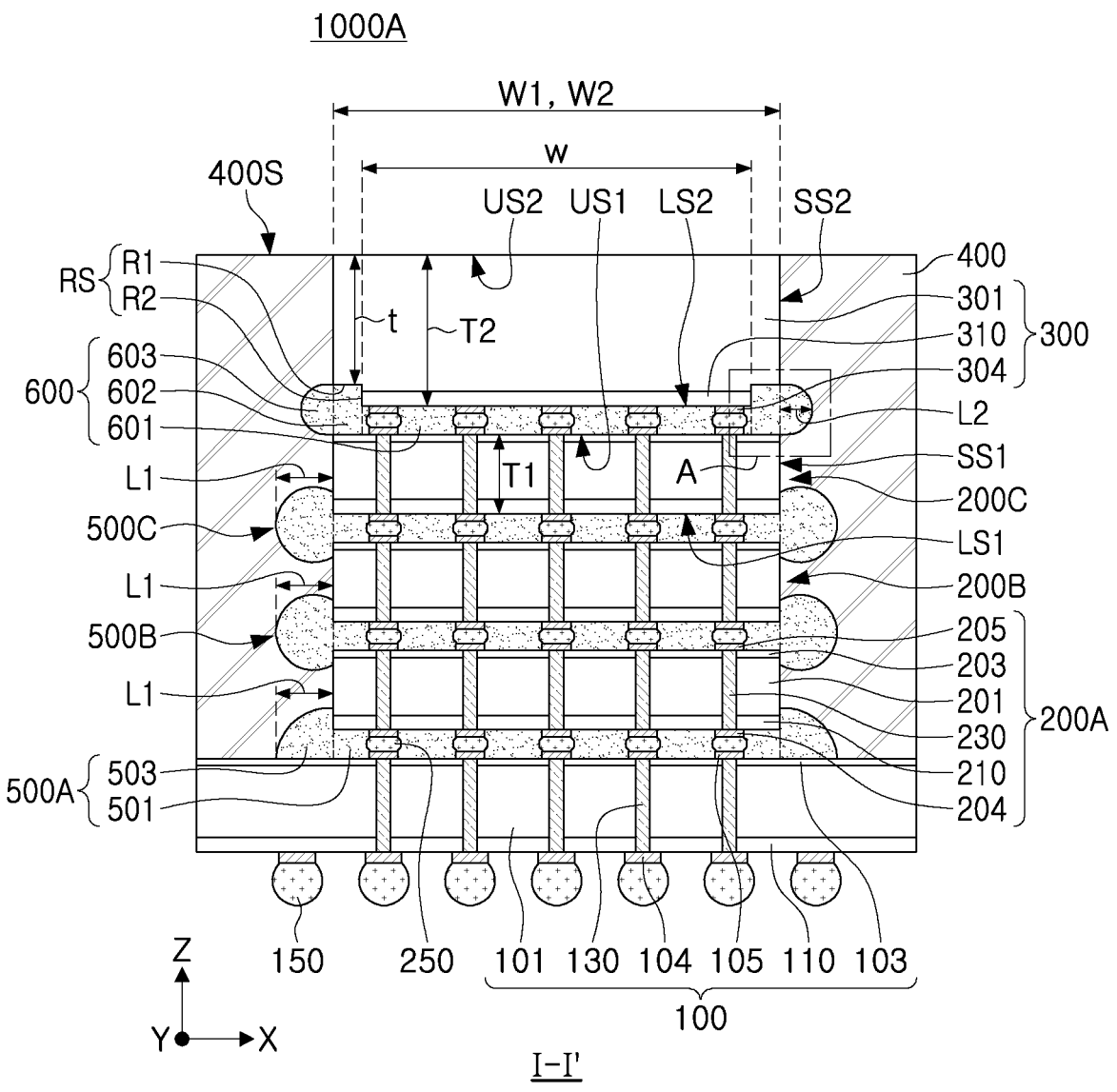
FIG. 1B is a cross-sectional view of FIG. 1A, taken along line I-I' according to an embodiment of the present inventive concept.
Figure 1C:
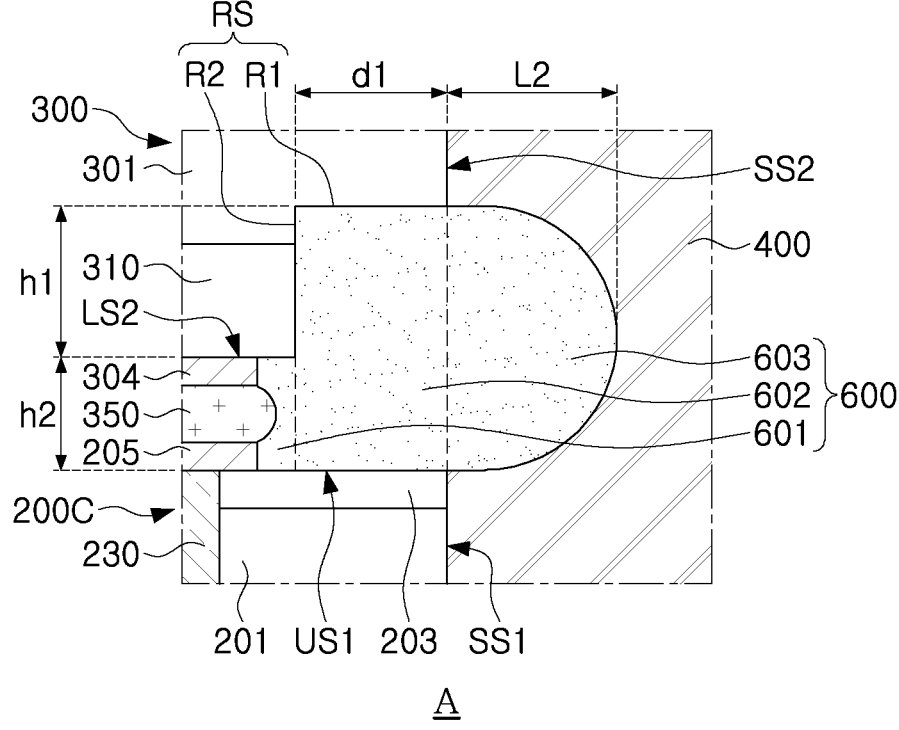
FIG. 1C is a partially enlarged view of portion 'A' of FIG. 1B according to an embodiment of the present inventive concept.

FIG. 1A is a plan view illustrating a semiconductor package 1000A according to an embodiment, FIG. 1B is a cross-sectional view of FIG. 1A, taken along line I-I', and FIG. 1C is a partially enlarged view of portion 'A' of FIG. 1B.

Referring to FIGS. 1A to IC, in an embodiment a semiconductor package 1000A may include a base chip 100, a plurality of vertically stacked semiconductor chips 200A, 200B, 200C, and 300, an encapsulant 400, and a plurality of adhesive films 500A, 500B, 500C, and 600. In thermal compression bonding for stacking and fixing the plurality of semiconductor chips 200A, 200B, 200C, and 300 on the base chip 100, extension portions of the plurality of adhesive films 500A, 500B, 500C, and 600 protruding towards side surfaces of the plurality of semiconductor chips 200A, 200B, 200C, and 300 may cause a defect in appearance and a decrease in reliability of the semiconductor package. According to an embodiment of the present inventive concept, a recess surface RS in which an uppermost adhesive film 600 (hereinafter referred to as 'second adhesive film') is accommodated is introduced below an uppermost semiconductor chip 300 (hereinafter referred to as 'second semiconductor chip') among the plurality of semiconductor chips 200A, 200B, 200C, and 300, to control a height of an extension portion 603 of the uppermost adhesive film 600. As a result, interference between lower adhesive films 500A, 500B, and 500C and the uppermost adhesive film 600 may be reduced, and the extension portion 603 of the uppermost adhesive film 600 may not be exposed to an outside of the encapsulant 400, to increase reliability of the semiconductor package 1000A.

Hereinafter, each component will be described in detail with reference to the drawings.

In an embodiment, the base chip 100 may include a substrate 101, an upper protective layer 103, an upper pad 105, a lower pad 104, a device layer 110, and a through-electrode 130. The base chip 100 may be, for example, a buffer chip including a plurality of logic devices and/or a plurality of memory devices in the device layer 110. However, embodiments of the present inventive concept are not necessarily limited thereto. Therefore, the base chip 100 may transmit a signal from the plurality of semiconductor chips 200A, 200B, 200C, and 300 stacked thereon externally, and may also transmit an external signal and external power to the plurality of semiconductor chips 200A, 200B, 200C, and 300. In an embodiment, the base chip 100 may perform both logic and memory functions by the logic devices and the memory devices. However, in some embodiments, the base chip 100 may include only the logic devices and may perform only the logic functions.

In an embodiment, the substrate 101 may include, for example, a semiconductor element such as silicon or germanium (Ge), or may include a compound semiconductor such as silicon carbide (SiC), gallium arsenide (GaAs), indium arsenide (InAs), or indium phosphide (InP). However, embodiments of the present inventive concept are not necessarily limited thereto. The substrate 101 may have a silicon on insulator (SOI) structure. The substrate 101 may include a conductive region, for example, a well doped with impurities or a structure doped with impurities. The substrate 101 may include various device isolation structures such as a shallow trench isolation (STI) structure.

The upper protective layer 103 may be formed on an upper surface of the substrate 101 (e.g., formed directly thereon in the Z direction), and may protect the substrate 101. In an embodiment, the upper protective layer 103 may be formed as an insulating layer such as a silicon oxide layer, a silicon nitride layer, or a silicon oxynitride layer. However, embodiments of the present inventive concept are not necessarily limited thereto and a material of the upper protective layer 103 may vary. For example, the upper protective layer 103 may be formed of a polymer such as polyimide (PI) or photosensitive polyimide (PSPI). In an embodiment, a lower protective layer may be further formed on a lower surface of the device layer 110.

The upper pad 105 may be disposed on the upper protective layer 103 (e.g., disposed directly thereon in the Z direction). In an embodiment, the upper pad 105 may include, for example, at least one compound selected from aluminum (Al), copper (Cu), nickel (Ni), tungsten (W), platinum (Pt), and gold (Au). The lower pad 104 may be disposed below the device layer 110 (e.g., disposed directly below in the Z direction), and may include a material similar to that of the upper pad 105. However, the materials of the upper pad 105 and the lower pad 104 are not necessarily limited to these materials.

The device layer 110 may be disposed on a lower surface of the substrate 101 (e.g., disposed directly on a lower surface of the substrate 101 in the Z direction), and may include various types of devices. For example, in an embodiment the device layer 110 may include a field effect transistor (FET) such as a planar FET, a FinFET, or the like, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), or the like, a logic device such as AND, OR, NOT, or the like, or various active elements and/or passive elements such as system large scale integration (LSI), a CMOS imaging sensor (CIS), a micro-electro-mechanical system (MEMS), or the like. However, embodiments of the present inventive concept are not necessarily limited thereto.

In an embodiment, the device layer 110 may include an interlayer insulating layer and a multilayer interconnection layer on the above-described devices. In an embodiment, the interlayer insulating layer may include silicon oxide or silicon nitride. The multilayer interconnection layer may include a multilayer interconnection and/or a vertical contact. The multilayer interconnection layer may connect devices of the device layer 110 to each other, may connect devices to a conductive region of the substrate 101, or may connect devices to the lower pad 104.

The through-electrode 130 may pass through the substrate 101 in a vertical direction (e.g., the Z-direction), and may provide an electrical path connecting the upper pad 105 and the lower pads 104 to each other. The through-electrode 130 may be electrically connected to the plurality of semiconductor chips 200A, 200B, 200C, and 300. The through-electrode 130 may include a conductive plug and a barrier film surrounding the conductive plug. In an embodiment, the conductive plug may include a metal material such as tungsten (W), titanium (Ti), aluminum (Al), or copper (Cu). The conductive plug may be formed by a plating process, a PVD process, or a CVD process. The barrier film may include titanium (Ti), titanium nitride (TiN), tantalum (Ta), or tantalum nitride (TaN), and may be formed by a plating process, a PVD process, or a CVD process. However, embodiments of the present inventive concept are not necessarily limited thereto. In an embodiment, a side insulating layer including an insulating material such as silicon oxide, silicon nitride, silicon oxynitride, or the like (e.g., a high aspect ratio process (HARP) oxide) may be formed between the through-electrode 130 and the substrate 101.

Connection bumps 150 may be disposed below the base chip 100 (e.g., in the Z direction). The connection bumps 150 may be electrically connected to the plurality of semiconductor chips 200A, 200B, 200C, and 300 through the through-electrode 130. In an embodiment, the connection bumps 150 may include, for example, tin (Sn) or an alloy containing tin (Sn) (e.g., Sn—Ag—Cu). In some embodiments, the connection bumps 150 may have a combination of a metal pillar and a solder ball. The connection bumps 150 may be electrically connected to an external device such as a module substrate, a system board, or the like.

The plurality of semiconductor chips 200A, 200B, 200C, and 300 may be composed of memory chips or memory devices that store or output data based on an address command, a control command, or the like, transmitted from the base chip 100. For example, in an embodiment the plurality of semiconductor chips 200A, 200B, 200C, and 300 may include volatile memory devices such as DRAM and SRAM, or non-volatile memory devices such as PRAM, MRAM, FeRAM, and RRAM. Among the plurality of semiconductor chips 200A, 200B, 200C, and 300, the uppermost semiconductor chip 300 (hereinafter referred to as 'second semiconductor chip') may not include the through-via 230, and an upper surface US2 thereof may be exposed from the encapsulant 400. However, embodiments of the present inventive concept are not necessarily limited thereto. A first metal bump 250 and a second metal bump 350 may be disposed between the plurality of semiconductor chips 200A, 200B, 200C, and 300. In an embodiment, the first metal bump 250 and the second metal bump 350 may include, for example, tin (Sn) or an alloy containing tin (Sn)

(e.g., Sn—Ag—Cu). In some embodiments, the first metal bump 250 and the second metal bump 350 may have a combination of a metal pillar and a solder ball.

The plurality of semiconductor chips 200A, 200B, 200C, and 300 may include at least one first semiconductor chip (200A, 200B, and 200C) disposed on the base chip 100, and a second semiconductor chip 300 disposed on the at least one first semiconductor chip (200A, 200B, and 200C).

In an embodiment, the at least one first semiconductor chip (200A, 200B, and 200C) may include a substrate 201, an upper protective layer 203, an upper pad 205 (which may also be referred to as a first rear surface pad), a lower pad 204 (which may also be referred to as a first front surface pad), a device layer 210, and a through-via 230. Since the substrate 201, the upper protective layer 203, the upper pad 205, the lower pad 204, the device layer 210, and the through-vias 230 may have characteristics, identical or similar to characteristics of the substrate 101, the upper protective layer 103, the upper pad 105, the lower pad 104, the device layer 110, and the through-electrode 130 in the base chip 100, overlapping descriptions thereof will be omitted for economy of description. According to an embodiment, the at least one first semiconductor chip (200A, 200B, and 200C) may be provided as a plurality of first semiconductor chips 200A, 200B, and 200C stacked on the base chip 100 in the vertical direction (e.g., the Z-direction).

The plurality of first semiconductor chips 200A, 200B, and 200C may have a first lower surface LS1 on which a first front surface pad 204 is disposed, a first upper surface US1 opposing the first lower surface LS1 (e.g., in the Z direction) and on which a first rear surface pad 205 is disposed, and a first side surface SS1 extending from an edge of the first lower surface LS1 to an edge of the first upper surface US1 (e.g., in the Z direction). The plurality of first semiconductor chips 200A, 200B, and 200C may be electrically connected to each other through the through-via 230 electrically connecting the first front surface pad 204 and the first rear surface pad 205. In some embodiments, the number of the plurality of first semiconductor chips 200A, 200B, and 200C may be two or four or more.

The second semiconductor chip 300 may include a substrate 301, a lower pad 304, and a device layer 310. Since the substrate 301, the lower pad 304, and the device layer 310 may have characteristics, identical or similar to characteristics of the substrate 201, the lower pad 204, and the device layer 210 of the first semiconductor chips 200A, 200B, and 200C, overlapping descriptions thereof will be omitted for economy of description.

The second semiconductor chip 300 may be disposed on an uppermost first semiconductor chip 200C among the plurality of first semiconductor chips 200A, 200B, and 200C, and may be electrically connected to the plurality of first semiconductor chips 200A, 200B, and 200C and the base chip 100 through the through-via 230. The second semiconductor chip 300 may have a second lower surface LS2 facing the first upper surface US1 of the uppermost first semiconductor chip 200C and on which a lower pad 304 is disposed, a second upper surface US2 opposing the second lower surface LS2 (e.g., in the Z direction), a second side surface SS2 extending from an edge of the second upper surface US2 (e.g., in the Z direction), and a recess surface RS extending from an edge of the second lower surface LS2 to an end of the second side surface SS2.

In an embodiment, the second upper surface US2 of the second semiconductor chip 300 may be substantially coplanar with an upper surface 400S of the encapsulant 400 (e.g., in the Z direction). In a horizontal direction (e.g., an X-direction), the second upper surface US2 of the second semiconductor chip 300 may have a width W2 that is equal to a width W1 of the first lower surface LS1 and a width W1 of the first upper surface US1 of each of the plurality of first semiconductor chips 200A, 200B, and 200C. In the horizontal direction (e.g., the X-direction), the second lower surface LS2 of the second semiconductor chip 300 may have a width w that is less than the width W1 of the first lower surface LS1 and the width W1 of the first upper surface US1 of each of the plurality of first semiconductor chips 200A, 200B, and 200C. From the same point of view, a width (e.g., in the X-direction) of a first central portion 501 of each of the first adhesive films 500A, 500B, and 500C may be greater than a width (e.g., in the X-direction) of a second central portion 601 of the second adhesive film 600. On a plane, the recess surface RS may continuously extend along an edge of the second semiconductor chip 300. However, embodiments of the present inventive concept are not necessarily limited thereto, such as shown in embodiments of FIGS. 2A and 2B.

The recess surface RS may control the height of the extension portion 603 of the uppermost adhesive film 600, to reduce interference between the lower adhesive films 500A, 500B, and 500C and the uppermost adhesive film 600, and to increase reliability of the semiconductor package 1000A.

The recess surface RS may include a horizontal surface R1 extending from the end of the second side surface SS2, and a vertical surface R2 extending from the edge of the second lower surface LS2 to one end (e.g., a first end that is inwardly positioned) of the horizontal surface R1. The horizontal surface R1 of the recess surface RS may be positioned at a level that is higher than the level of the second lower surface LS2 (e.g., in the Z direction). Among the plurality of adhesive films 500A, 500B, 500C, and 600, the uppermost adhesive film 600 may be disposed in the recess surface RS. In an embodiment, the recess surface RS may be formed to have a predetermined size, to control a height, a length, or the like of the extension portion 603 (hereinafter referred to as 'second extension portion') of the second adhesive film 600.

For example, in an embodiment in a direction (e.g., the Z-direction), perpendicular to the second lower surface LS2 of the second semiconductor chip 300, a height h1 from the second lower surface LS2 to the horizontal surface R1 of the recess surface RS may be greater than a height h2 from the first upper surface US1 to the second lower surface LS2 of the uppermost first semiconductor chip 200C among the plurality of first semiconductor chips 200A, 200B, and 200C. In an embodiment, the height h1 from the second lower surface LS2 to the horizontal surface R1 of the recess surface RS may be in a range of about 30 μm to about 45 μm, and the height h2 from the first upper surface US1 to the second lower surface LS2 of the uppermost first semiconductor chip 200C may be in a range about 5 μm to about 20 μm. However, embodiments of the present inventive concept are not necessarily limited thereto.

For example, a distance dl from the second side surface SS2 to the vertical surface R2 of the recess surface RS in a direction (e.g., the X-direction), perpendicular to the second side surface SS2 of the second semiconductor chip 300 may be greater than or equal to the height h1 from the second lower surface LS2 to the horizontal surface R1 of the recess surface RS in a direction (e.g., the Z-direction), perpendicular to the second lower surface LS2. In an embodiment, the distance dl from the second side surface SS2 to the vertical surface R2 of the recess surface RS may be in a range of about 50 μm to about 100 sm. However, embodiments of the present inventive concept are not necessarily limited thereto.

For example, in an embodiment a thickness t (e.g., length in the Z direction) from the recess surface RS (e.g., the horizontal surface R1) of the second semiconductor chip 300 to the second upper surface US2 may be twice or more (e.g., at least about 200%) greater than a thickness T1 ('thickness of the first semiconductor chip') which may be a length in the Z direction from the first lower surface LS1 to the first upper surface US1 of at least one of the plurality of first semiconductor chips 200A, 200B, and 200C. A thickness T2 ('thickness of the second semiconductor chip') from the second lower surface LS2 to the second upper surface US2 of the second semiconductor chip 300 may be greater than the thickness T1 ('the thickness of the first semiconductor chip') from the first lower surface LS1 to the first upper surface US1.

In an embodiment, the encapsulant 400 may encapsulate the plurality of first semiconductor chips 200A, 200B, and 200C, and the second semiconductor chip 300 on the base chip 100. The encapsulant 400 may surround side surfaces of the plurality of first semiconductor chips 200A, 200B, and 200C and side surfaces of the second semiconductor chips 300. The encapsulant 400 may be formed to expose the second upper surface US2 of the second semiconductor chip 300. However, embodiments of the present inventive concept are not necessarily limited thereto and in some embodiments, the encapsulant 400 may be formed to cover the second upper surface US2 of the second semiconductor chip 300. In an embodiment, the encapsulant 400 may be formed of, for example, an insulating material such as an epoxy mold compound (EMC). However, embodiments of the present inventive concept are not necessarily limited thereto and a material of the encapsulant 400 may vary.

The plurality of adhesive films 500A, 500B, 500C, and 600 may surround the first and second metal bumps 250 and 350, and may fix the plurality of semiconductor chips 200A, 200B, 200C, and 300 to the base chip 100. In an embodiment, the plurality of adhesive films 500A, 500B, 500C, and 600 may be a non-conductive film (NCF). However, embodiments of the present inventive concept are not necessarily limited thereto, and may include, for example, all kinds of polymer films capable of performing a thermal compression bonding process. The plurality of adhesive films 500A, 500B, 500C, and 600 may form extension portions 503 and 603 protruding further outwardly than the plurality of semiconductor chips 200A, 200B, 200C, and 300 (e.g., from the first side surface SS1 in the X direction or Y direction) by the thermal compression bonding process.

The plurality of adhesive films 500A, 500B, 500C, and 600 may be disposed below each of the plurality of semiconductor chips 200A, 200B, 200C, and 300 (e.g., directly therebelow in the Z direction). For example, the plurality of adhesive films 500A, 500B, 500C, and 600 may include at least one first adhesive film (500A, 500B, and 500C) corresponding to at least one first semiconductor chip (200A, 200B, and 200C), and the second adhesive film 600 between the uppermost first semiconductor chip 200C and the second semiconductor chip 300.

The at least one first adhesive film (500A, 500B, and 500C) may include a plurality of first adhesive films 500A, 500B, and 500C respectively corresponding to a plurality of first semiconductor chips 200A, 200B, and 200C. Each of the plurality of first adhesive films 500A, 500B, and 500C may have a first central portion 501 and a first extension portion 503. The first central portion 501 may overlap the plurality of first semiconductor chips 200A, 200B, and 200C in the vertical direction (e.g., the Z-direction). The first extension portion 503 may extend from the first central portion 501 further outwardly than the first side surface SS1 of each of the plurality of first semiconductor chips 200A, 200B, and 200C, and may not overlap the plurality of first semiconductor chips 200A, 200B, and 200C in the vertical direction (e.g., the Z-direction). The first extension portion 503 may be in direct contact with at least a portion of the first side surface SS1 of at least one adjacent first semiconductor chip (200A, 200B, and 200C) among the plurality of first semiconductor chips 200A, 200B, and 200C. For example, the first extension portions 503 may overlap at least one of the plurality of first semiconductor chips 200A, 200B, and 200C in the horizontal direction (e.g., the X-direction).

Embodiments of the present inventive concept may limit a size of the second extension portion 603 of the second adhesive film 600 using the recess surface RS of the second semiconductor chip 300, and may increase the reliability of the semiconductor package 1000A.

The second adhesive film 600 may be disposed below the second semiconductor chip 300. At least a portion of the second adhesive film 600 may be disposed in the recess surface RS. For example, the second adhesive film 600 may be in direct contact with at least a portion of the horizontal surface R1 and the vertical surface R2. The second adhesive film 600 may have a second central portion 601, an edge portion 602, and a second extension portion 603. The second central portion 601 may fill a space between the first upper surface US1 of the uppermost first semiconductor chip 200C and the second lower surface LS2 of the second semiconductor chip 300, and may overlap the second lower surface LS2 of the second semiconductor chip 300 in the vertical direction (e.g., the Z-direction). The edge portion 602 may fill a space between the first upper surface US1 of the uppermost first semiconductor chip 200C and the recess surface RS, and may overlap the recess surface RS of the second semiconductor chip 300 in the vertical direction (the Z-direction). The edge portion 602 may only overlap the second lower surface LS2 of the second semiconductor chip 300 in the horizontal direction (e.g., the X-direction) and may not extend further outwardly than the second side surface SS2 of the second semiconductor chip 300.

The second extension portion 603 may extend from the edge portion 602 further outwardly than the second side surface SS2 of the second semiconductor chip 300 (e.g., in the X direction or the Y direction), and may not overlap the second lower surface LS2 and the recess surface RS of the second semiconductor chip 300 in the vertical direction (the Z-direction). The second extension portion 603 may not be in direct contact with the second side surface SS2 of the second semiconductor chip 300 and/or the first side surface SS1 of the uppermost first semiconductor chip 200C. For example, the second extension portion 603 may not overlap the plurality of first semiconductor chips 200A, 200B, and 200C or the second semiconductor chip 300 in the horizontal direction (e.g., the X-direction).

A size of the second extension portion 603 may be limited by the recess surface RS. For example, in the horizontal direction (e.g., the X-direction), a length L2 of the second extension portion 603 may be less than a length L1 of each of the first extension portions 503. On a plane, the second extension portion 603 may not be exposed to an outside of the encapsulant 400. For convenience of explanation, lengths L1 of first extension portions 503 of the plurality of first adhesive films 500A, 500B, and 500C are illustrated to be equal to each other. However, embodiments of the present inventive concept are not necessarily limited thereto and the first extension portions 503 of the plurality of first adhesive films 500A, 500B, and 500C may have different lengths L1, respectively. The length L1 of each of the first extension portions 503 may be defined as a distance from an end of each first extension portion 503 to the first side surface SS1 in a direction (e.g., the X-direction), perpendicular to the first side surface SS1. The length L2 of the second extension portion 603 may be defined as a distance from an end of the second extension portion 603 to the second side surface SS2 in a direction (e.g., the X-direction), perpendicular to the second side surface SS2.

Figure 2A:
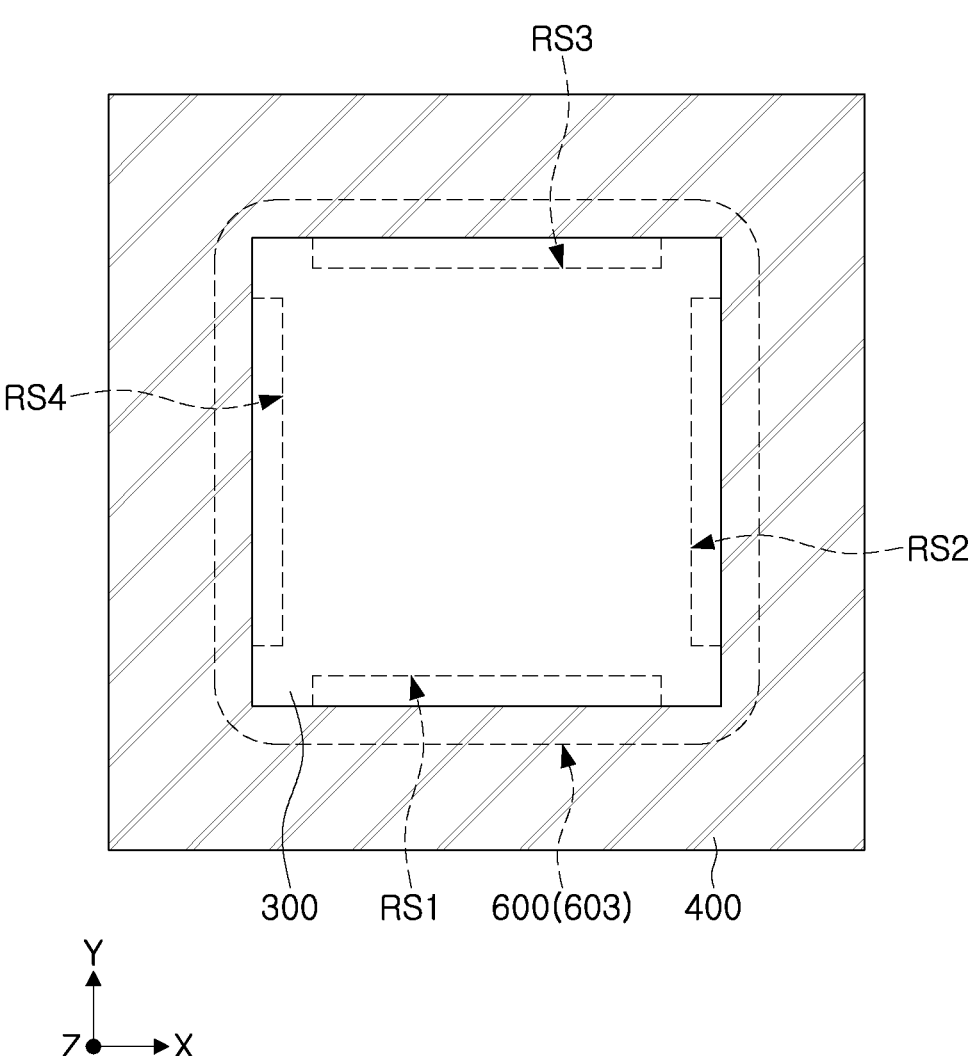
FIGS. 2A and 2B are plan views illustrating a modified example to the recess surface illustrated in FIG. 1A.
Figure 2B:
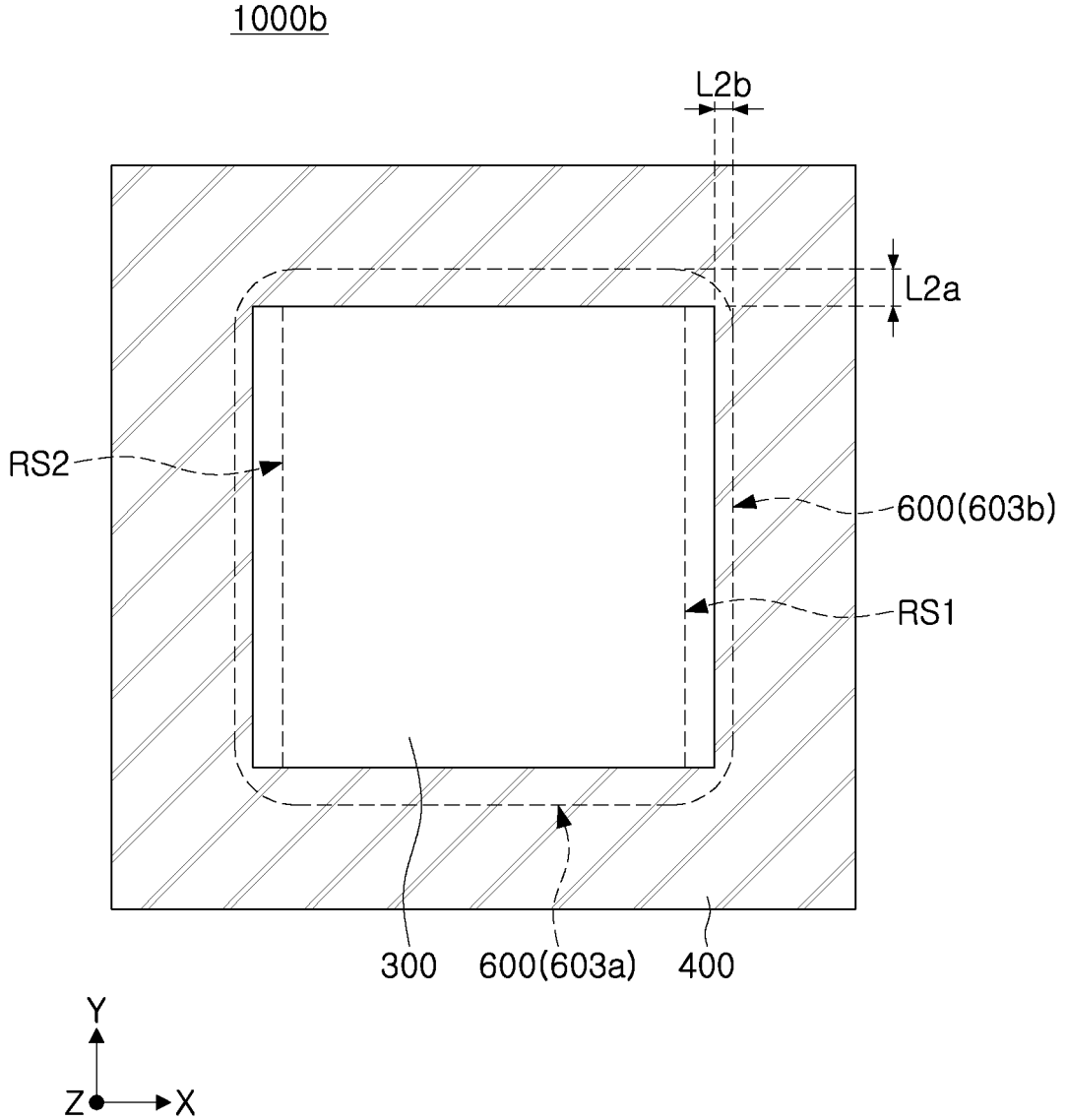

FIGS. 2A and 2B are plan views illustrating a modified example to the recess surface RS illustrated in FIG. 1A.

Referring to FIG. 2A, in a semiconductor package 1000a of a modified example, a second semiconductor chip 300 may include a plurality of recess surfaces RS1, RS2, RS3, and RS4 spaced apart from each other (e.g., in the X and/or Y directions). The number of recess surfaces RS1, RS2, RS3, and RS4 may correspond to sides of the second semiconductor chip 300. For example, in an embodiment the second semiconductor chip 300 may include a first recess surface RS1, a second recess surface RS2, a third recess surface RS3, and a fourth recess surface RS4, respectively corresponding to four sides. On a plane, a second adhesive film 600 may have a second extension portion 603 protruding further outwardly than the second semiconductor chip 300. In an embodiment, a length of the second extension portion 603 protruding from each of the sides of the second semiconductor chip 300 may not be constant along a circumference of the second semiconductor chip 300. For example, a length (e.g., a length protruding from the side of the second semiconductor chip 300) of the second extension portion 603 adjacent to a vertex of the second semiconductor chip 300 may be less than a length (e.g., a length protruding from the side of the second semiconductor chip 300) of the second extension portion 603 adjacent to a side of the second semiconductor chip 300. While an embodiment of FIG. 2A shows a length of the second extension portion 603 adjacent to the sides of the second semiconductor chip 300 to be uniform. However, embodiments of the present inventive concept are not necessarily limited thereto and a length of the second extension portion 603 adjacent to any one side of the second semiconductor chip 300 may not be uniform.

Referring to an embodiment of FIG. 2B, in a semiconductor package 1000b of a modified example, a second semiconductor chip 300 may include at least one recess surface (RS1 and RS2) disposed on only a portion of side surfaces of the second semiconductor chip 300. For example, in an embodiment shown in FIG. 2B the at least one recess surface (RS1 and RS2) may include a first recess surface RS1 and a second recess surface RS2, respectively corresponding to a first side and a second side of the second semiconductor chip 300 which are an upper side and a lower side of the second semiconductor chip (e.g., in the Y direction). However, embodiments of the present inventive concept are not necessarily limited thereto and the number of sides that the at least one recess surface is disposed on and the specific sides that the at least one recess surface may be disposed on may vary. A length of the second extension portion 603 protruding from each of the sides of the second semiconductor chip 300 may be modified depending on whether adjacent recess surfaces RS1 and RS2 exist. For example, a length L2b of a second extension portion 603b adjacent to the first and second recess surfaces RS1 and RS2 shown in an embodiment of FIG. 2B may be less than a length L2a of a second extension portion 603a that is not adjacent to the recess surfaces.

FIGS. 3A to 3D are partially enlarged views illustrating a modified example of the adhesive film 600 and the recess surface RS illustrated in FIG. 1C.

Figure 3A:
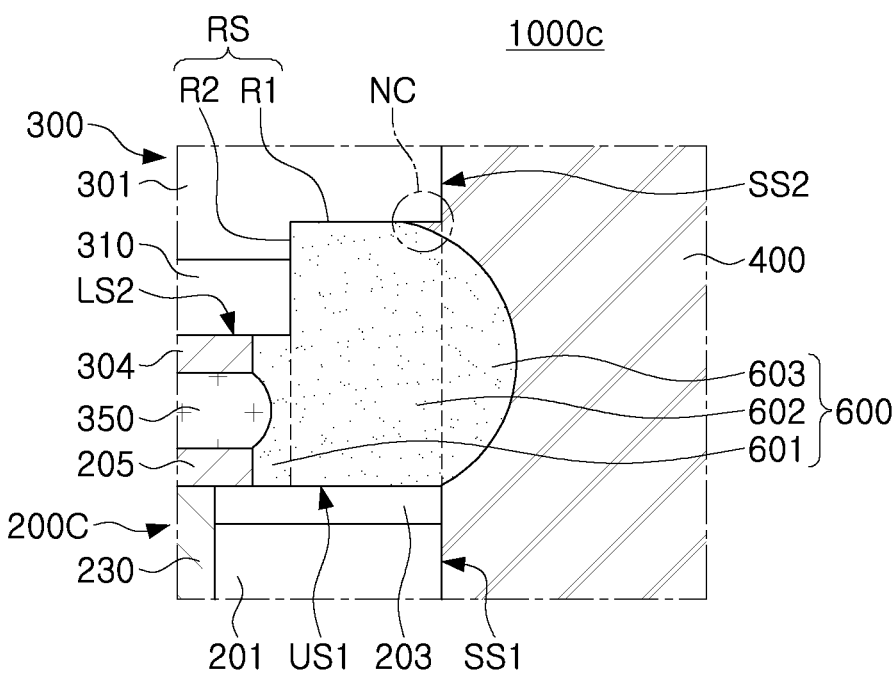
FIGS. 3A to 3D are partially enlarged views illustrating a modified example of the adhesive film and the recess surface illustrated in FIG. 1C according to an embodiment of the present inventive concept.

Referring to FIG. 3A, in a semiconductor package 1000c of a modified example, a second adhesive film 600 may be in direct contact with only a portion of a horizontal surface R1 of a recess surface RS. An edge portion 602 of the second adhesive film 600 may directly contact an entirety of a vertical surface R2 of the recess surface RS. The edge portion 602 of the second adhesive film 600 may not be in direct contact with (e.g., is spaced apart from) a region NC of the horizontal surface R1 of the recess surface RS. For example, in an embodiment, the second adhesive film 600 may not directly contact the region NC of the horizontal surface R1 of the recess surface RS that is disposed at an edge of the horizontal surface R1 that is farthest from the second lower surface LS2.

Figure 3B:
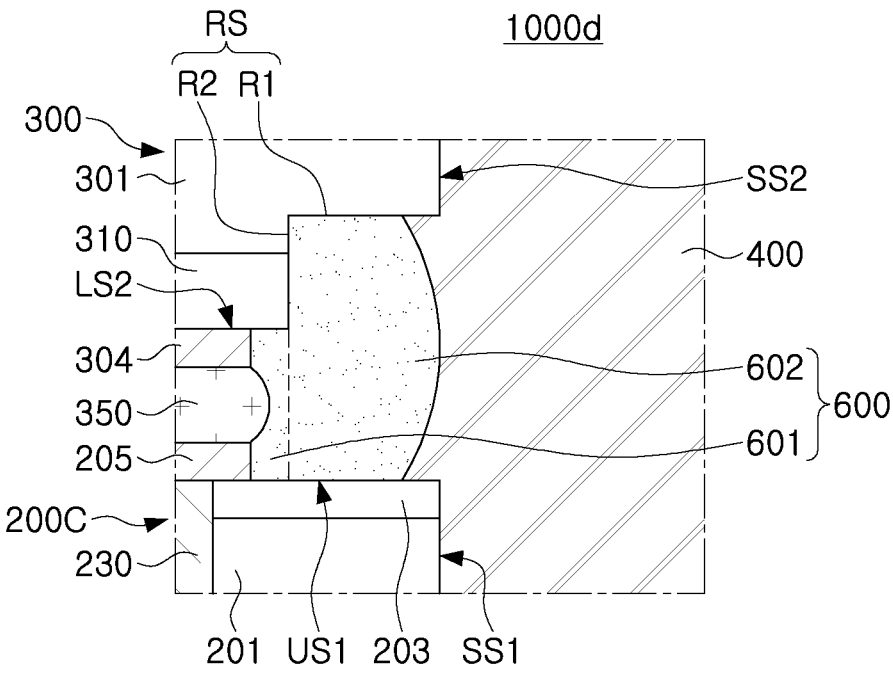

Referring to FIG. 3B, in a semiconductor package 1000d of a modified example, a second adhesive film 600 may not protrude outwardly past a second side surface SS2 of a second semiconductor chip 300. For example, the second adhesive film 600 of the modified example may only include a second central portion 601 and an edge portion 602 and may not include a second extension portion 603. The second central portion 601 overlaps a second lower surface LS2 of the second semiconductor chip 300 in the vertical direction (the Z-direction), and an edge portion 602 overlaps a recess surface RS of the second semiconductor chip 300 in the vertical direction (the Z-direction). A shape of the second adhesive film 600 or the edge portion 602, filling the recess surface RS, may be variously modified according to a size of the recess surface RS, a volume of the second adhesive film 600, or the like.

Figure 3C:
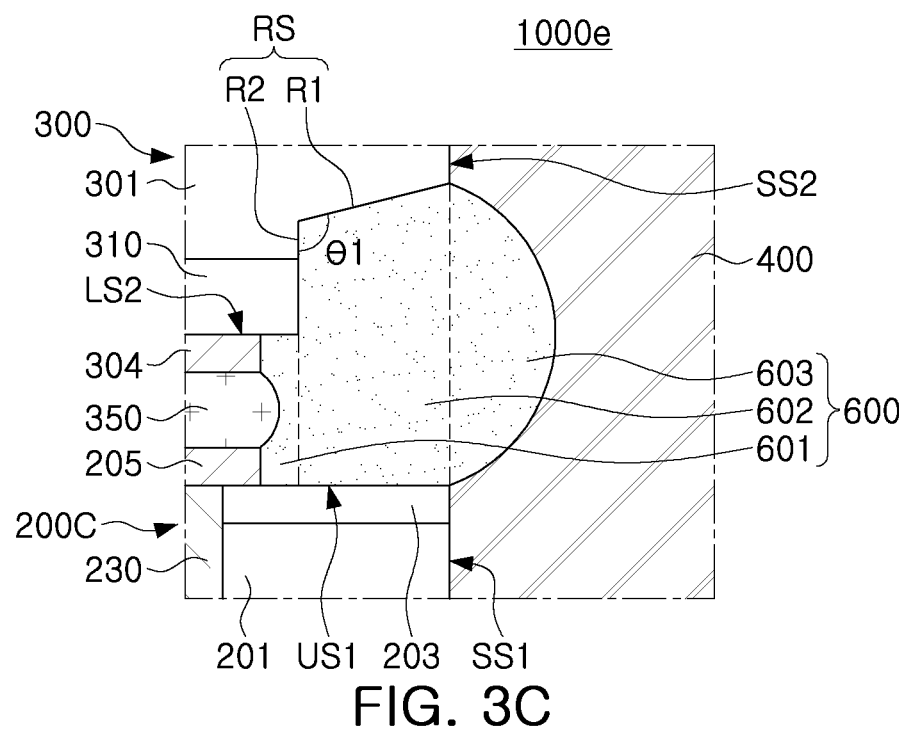

Referring to FIG. 3C, in a semiconductor package 1000e of a modified example, an angle inside a recess surface RS may be an obtuse angle. For example, in an embodiment a first angle θ1 between a horizontal surface R1 and a vertical surface R2 of the recess surface RS may be in a range of about 90 degrees to about 140 degrees, about 90 degrees to about 130 degrees, or about 90 degrees to about 120 degrees. However, embodiments of the present inventive concept are not necessarily limited thereto.

Figure 3D:
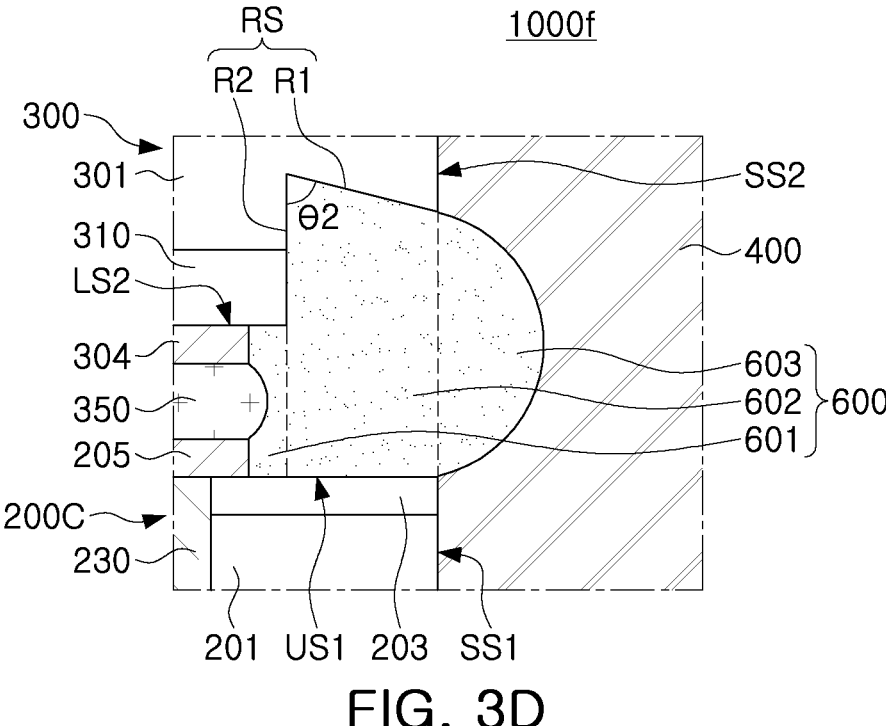

Referring to FIG. 3D, in a semiconductor package 1000f of a modified example, an angle inside a recess surface RS may be an acute angle. For example, a second angle θ2 between a horizontal surface R1 and a vertical surface R2 of the recess surface RS may be in a range of about 40 degrees to about 90 degrees, about 50 degrees to about 90 degrees, or about 60 degrees to about 90 degrees. However, embodiments of the present inventive concept are not necessarily limited thereto. The angle inside the recess surface RS may be variously modified according to a process.

Figure 4:
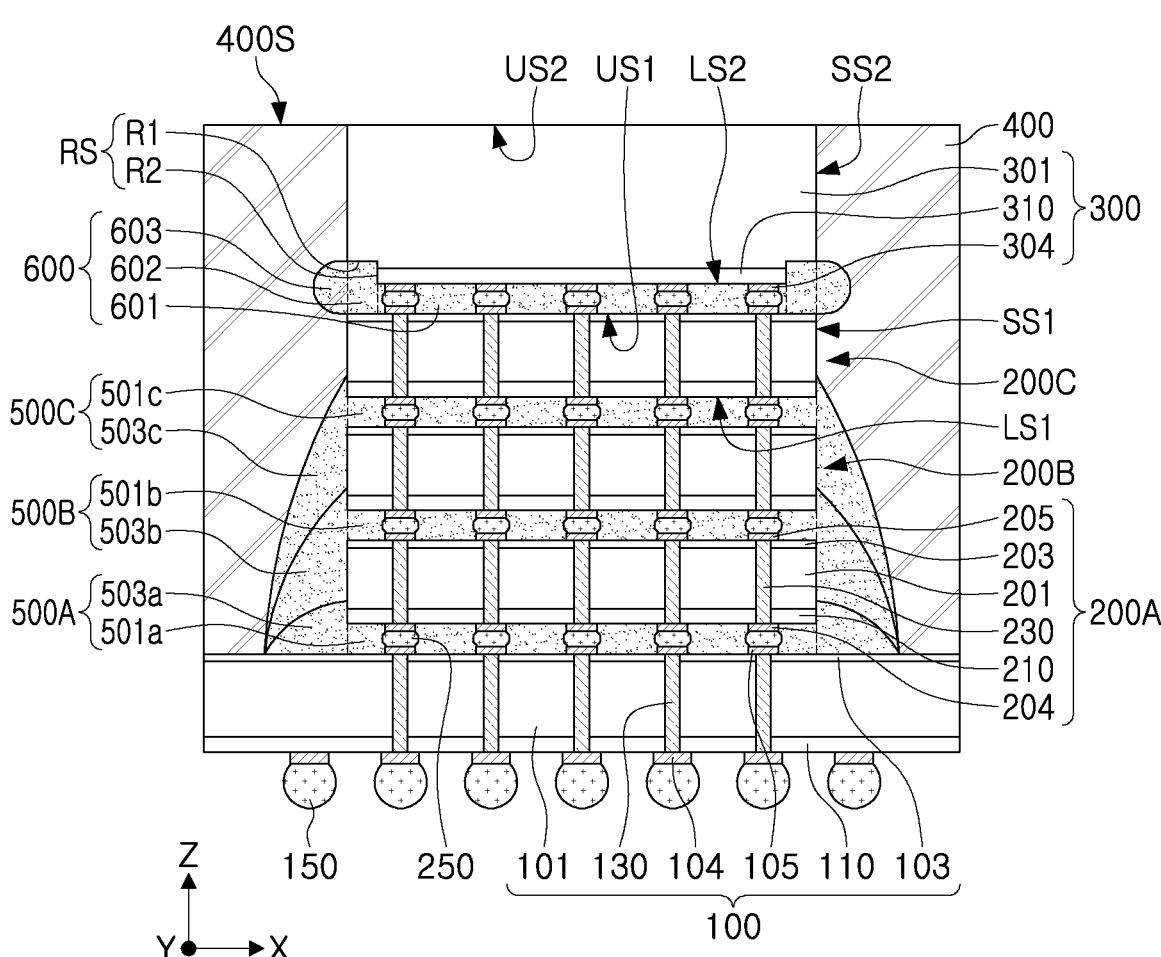
FIG. 4 is a cross-sectional view illustrating a semiconductor package according to an embodiment of the present inventive concept.

FIG. 4 is a cross-sectional view illustrating a semiconductor package 1000B according to an embodiment.

Referring to FIG. 4, a semiconductor package 1000B according to an embodiment may have characteristics, identical or similar to characteristics illustrated with reference to FIGS. 1A to 3D, except that a plurality of first adhesive films 500A, 500B, and 500C extend up to an upper surface of a base chip 100. Therefore, a repeated description of identical or similar elements may be omitted for economy of description.

In an embodiment as shown in FIG. 4, the plurality of first adhesive films 500A, 500B, and 500C may include a lowermost first adhesive film 500A, an intermediate first adhesive film 500B, and an uppermost first adhesive film 500C. The lowermost first adhesive film 500A, the intermediate first adhesive film 500B, and the uppermost first adhesive film 500C may be distinguished from each other by a boundary surface. The lowermost first adhesive film 500A may have a lowermost central portion 501a and a lowermost extension portion 503a. The intermediate first adhesive film 500B may have an intermediate central portion 501b and an intermediate extension portion 503b. The uppermost first adhesive film 500C may have an uppermost central portion 501c and an uppermost extension portion 503c.

In an embodiment, the first extension portions 503a, 503b, and 503c may each have a shape in which a width increases towards a lower portion adjacent to the base chip 100. Surfaces of the first extension portions 503a, 503b, and 503c may form curved surfaces or inclined surfaces (e.g., inclined shapes) having a certain slope. For example, the first extension portions 503a, 503b, and 503c of an embodiment shown in FIG. 4 may have a shape in which a width of a lower portion is widened and a width of an upper portion is narrow. In an embodiment, this structure may be implemented by repeating processes of stacking a lowermost first semiconductor chip 200A on the base chip 100 as a wafer, laminating with a foil, performing a pressure-reflow process, stacking an intermediate first semiconductor chip 200B, laminating with a foil, and performing a pressure-reflow process.

In an embodiment, widths of lower surfaces of each of the first extension portions 503a, 503b, and 503c may be substantially the same as each other. However, embodiments of the present inventive concept are not necessarily limited thereto. For example, the lowermost extension portion 503a, the intermediate extension portion 503b, and the uppermost extension portion 503c in sequence may be narrowed, lengths of the first extension portions 503a, 503b, and 503c may be defined by the lowermost extension portion 503a, but depending on an embodiment, when the intermediate extension portion 503b or the uppermost extension portion 503c protrudes the most, the lengths of the first extension portions 503a, 503b, and 503c may be defined by the intermediate extension portion 503b or the uppermost extension portion 503c.

Figure 5:
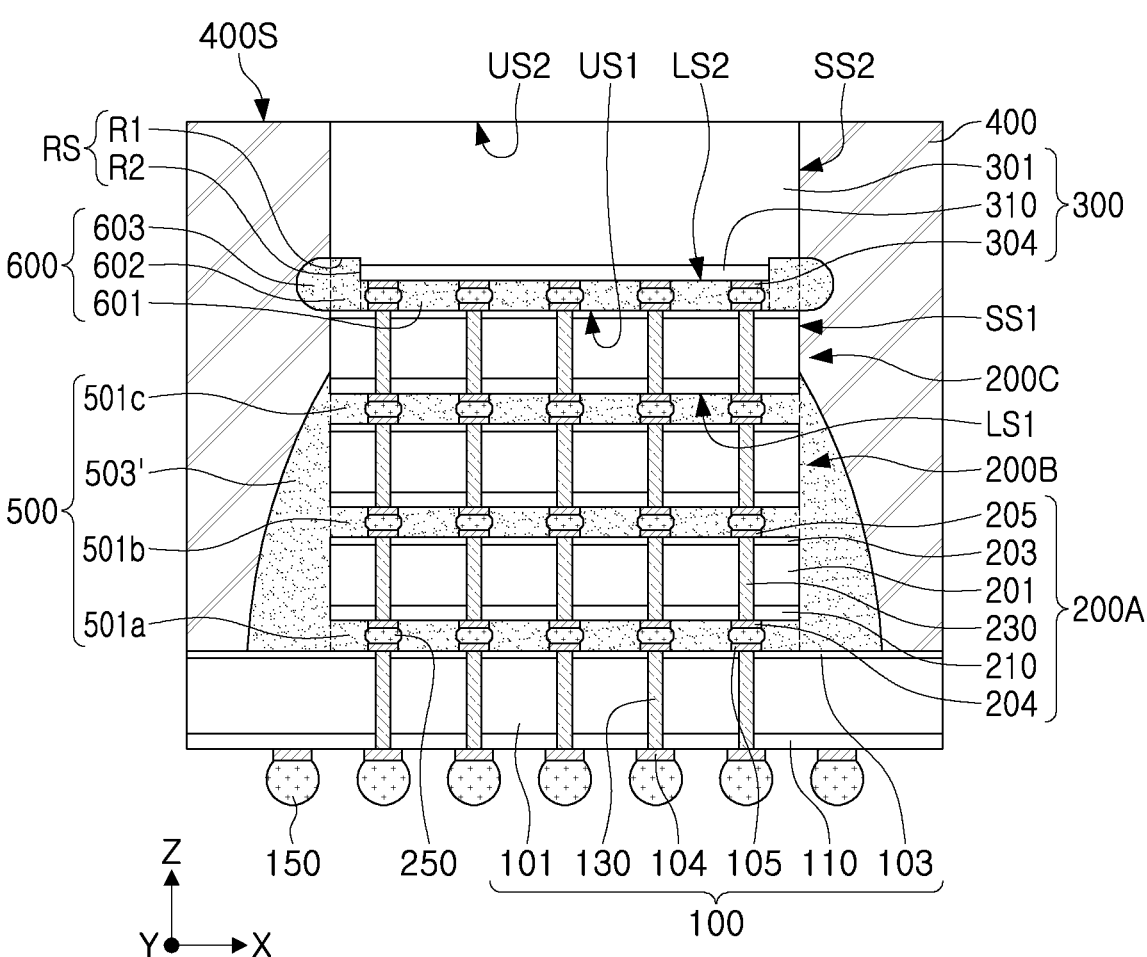
FIG. 5 is a cross-sectional view illustrating a semiconductor package according to an embodiment of the present inventive concept.

FIG. 5 is a cross-sectional view illustrating a semiconductor package 1000C according to an embodiment.

Referring to FIG. 5, a semiconductor package 1000C according to an embodiment may have characteristics, identical or similar to characteristics illustrated with reference to FIGS. 1A to 4, except for including a first adhesive film 500 having an integral structure. Therefore, a repeated description of identical or similar elements may be omitted for economy of description.

The first adhesive film 500 according to an embodiment may have an integrated extension portion 503' extending from a lowermost central portion 501a, an intermediate central portion 501b, and an uppermost central portion 501c. The integrated extension portion 503' may have a shape in which a width increases towards a lower portion adjacent to a base chip 100. The surface of the integrated extension portion 503' may form a curved surface or an inclined surface having a certain slope. In an embodiment, this structure may be implemented by laminating first semiconductor chips 200A, 200B, and 200C, sequentially stacked, with a foil on the base chip 100 as a wafer and then performing a pressure-reflow process.

Figure 6:
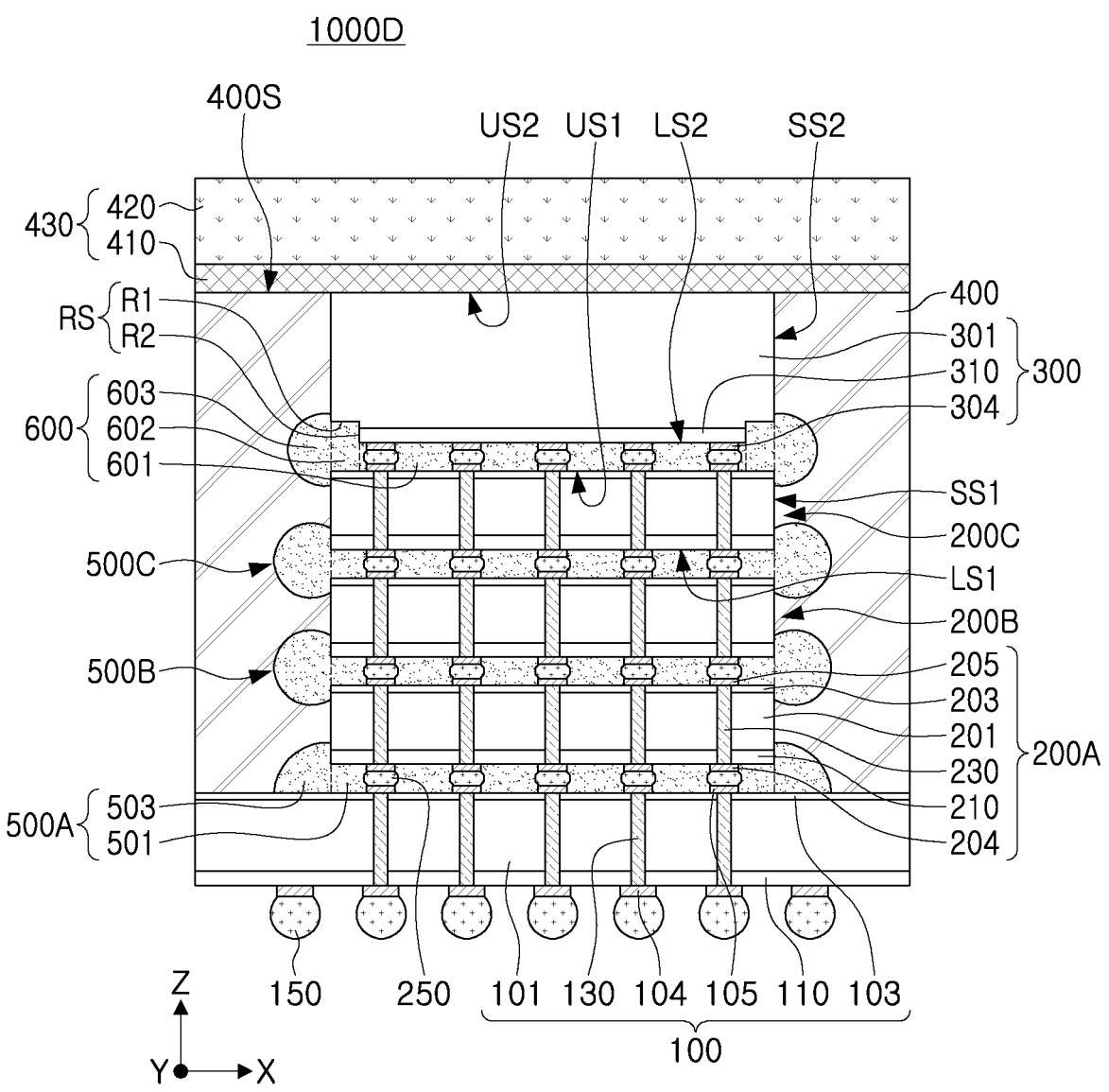
FIG. 6 is a cross-sectional view illustrating a semiconductor package according to an embodiment of the present inventive concept.

FIG. 6 is a cross-sectional view illustrating a semiconductor package 1000D according to an embodiment.

Referring to FIG. 6, a semiconductor package 1000D according to an embodiment may have characteristics, identical or similar to characteristics illustrated with reference to FIGS. 1A to 5, except for further including a heat dissipation structure 430 disposed on an encapsulant 400. For example, the heat dissipation structure 430 may be disposed on (e.g., directly thereon) an upper surface of the encapsulant 400 (e.g., in the Z direction). Therefore, a repeated description of identical or similar elements may be omitted for economy of description. The heat dissipation structure 430 may control warpage of the semiconductor package 1000D, and may discharge heat generated from a plurality of semiconductor chips 200A, 200B, 200C, and 300 externally. The heat dissipation structure 430 may include a heat dissipation plate 420, and an insulating thermal conduction layer 410 bonding the heat dissipation plate 420 and a second semiconductor chip 300 to each other. In an embodiment, the heat dissipation plate 420 may be formed of a material having excellent thermal conductivity, for example, aluminum (Al), gold (Au), silver (Ag), copper (Cu), iron (Fe), graphite, graphene, or the like. In an embodiment, the heat dissipation plate 420 may have a plate shape. However, embodiments of the present inventive concept are not necessarily limited thereto. In an embodiment, the insulating thermal conduction layer 410 may include a thermal interface material (TIM) such as a thermally conductive adhesive tape, a thermally conductive grease, a thermally conductive adhesive, or the like.

Figure 7A:
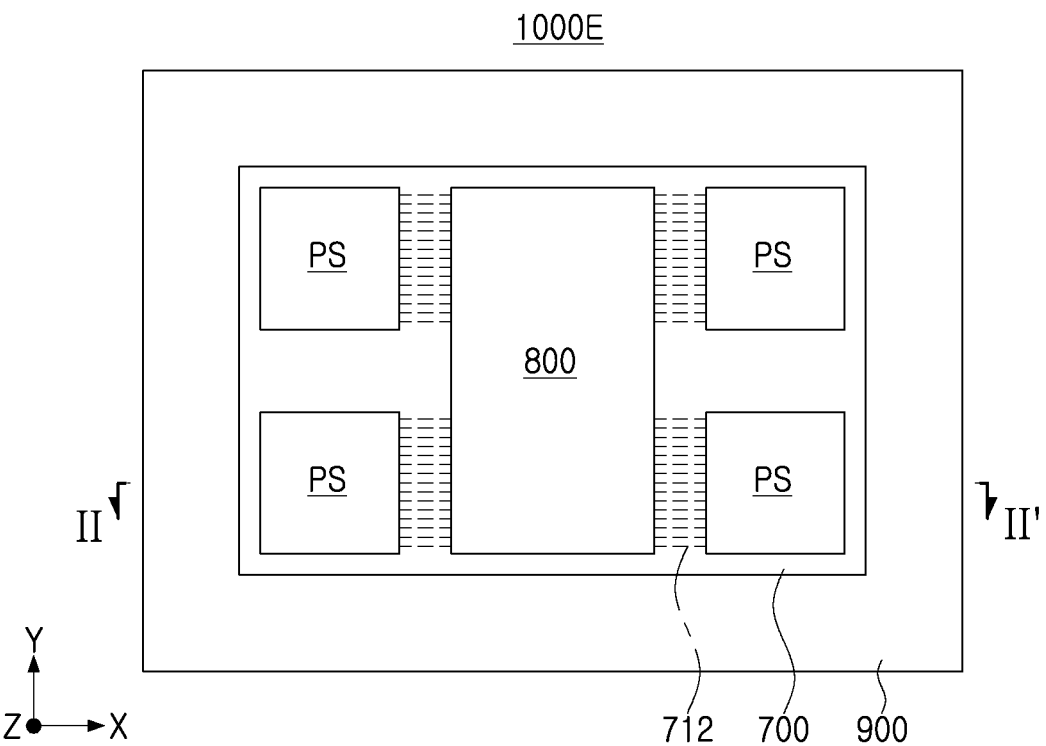
FIG. 7A is a plan view illustrating a semiconductor package according to an embodiment of the present inventive concept.
Figure 7B:
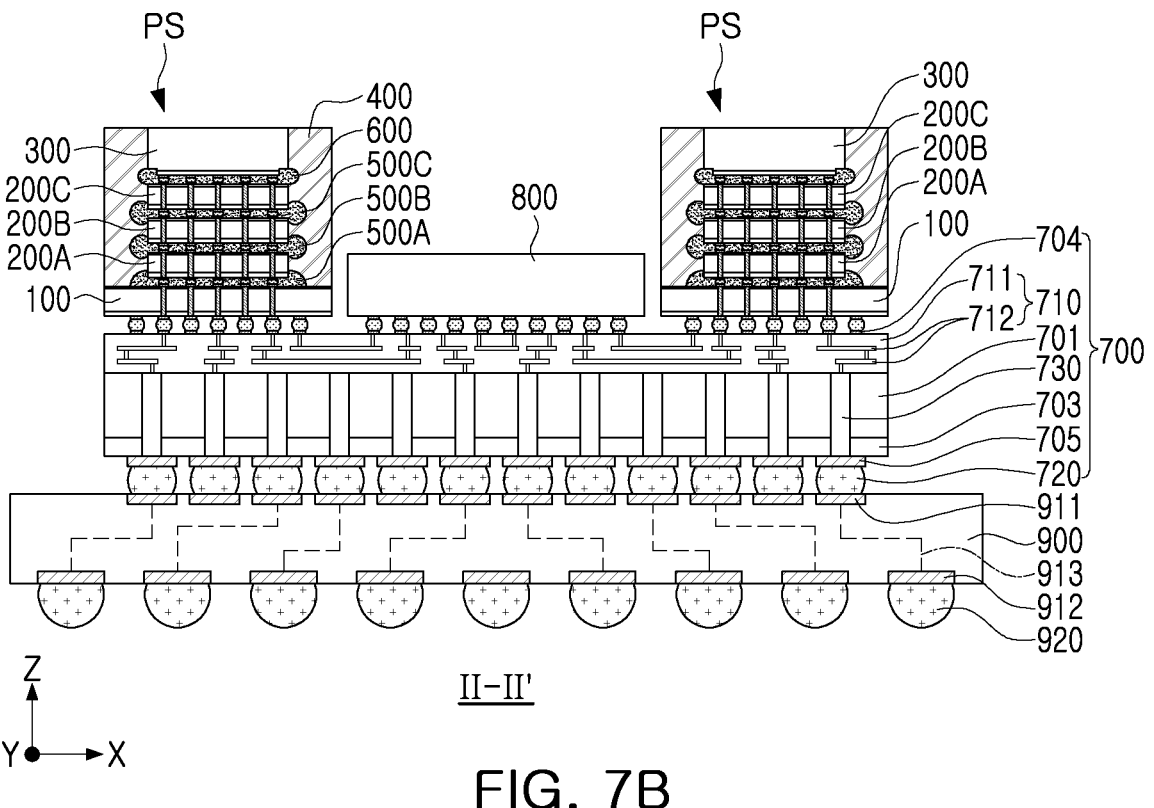
FIG. 7B is a cross-sectional view of FIG. 7A, taken along line II-II', according to an embodiment of the present inventive concept.

FIG. 7A is a plan view illustrating a semiconductor package 1000E according to an embodiment, and FIG. 7B is a cross-sectional view of FIG. 7A, taken along line II-II'.

Referring to FIGS. 7A and 7B, a semiconductor package 1000E according to an embodiment may include a package substrate 900, an interposer substrate 700, at least one chip structure PS, and a processor chip 800. The chip structure PS may have characteristics identical to or similar to those of the semiconductor packages 1000A, 1000B, 1000C, 1000D, 1000a, 1000b, 1000c, 1000d, 1000e, and 1000f described with reference to FIGS. 1A to 6. Therefore, a repeated description of identical or similar elements may be omitted for economy of description.

In an embodiment, the package substrate 900 may be a support substrate on which the interposer substrate 700, the processor chip 800, and the chip structure PS are mounted, and may be a substrate for a semiconductor package including a printed circuit board (PCB), a ceramic substrate, a glass substrate, a tape interconnection board, and the like. A body of the package substrate 900 may include different materials depending on a type of substrate. For example, in an embodiment in which the package substrate 900 is a printed circuit board, the package substrate 900 may be formed by additionally stacking an interconnection layer on one or both surfaces of a body copper-clad laminate or a copper-clad laminate.

In an embodiment, the package substrate 900 may include a lower terminal 912, an upper terminal 911, and a redistribution circuit 913. The upper terminal 911, the lower terminal 912, and the redistribution circuit 913 may form an electrical path connecting a lower surface and an upper surface of the package substrate 900. In an embodiment, the upper terminal 911, the lower terminal 912, and the redistribution circuit 913 may be formed of a metal material such as at least one metal of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), or carbon (C), or an alloy containing two or more metals thereof. However, embodiments of the present inventive concept are not necessarily limited thereto. An external connection terminal 920 connected to the lower terminal 912 may be disposed on (e.g., disposed directly thereon) the lower surface of the package substrate 900. In an embodiment, the external connection terminal 920 may include tin (Sn), indium (In), bismuth (Bi), antimony (Sb), copper (Cu), silver (Ag), zinc (Zn), lead (Pb), and/or an alloys thereof. However, embodiments of the present inventive concept are not necessarily limited thereto.

In an embodiment, the interposer substrate 700 may include a substrate 701, a lower protective layer 703, a lower pad 705, an interconnection structure 710, a metal bump 720, and a through-via 730. The chip structure PS and the processor chip 800 may be electrically connected to each other via the interposer substrate 700.

In an embodiment, the substrate 701 may be formed of, for example, any one of a silicon substrate, an organic substrate, a plastic substrate, and a glass substrate. In an embodiment in which the substrate 701 is a silicon substrate, the interposer substrate 700 may be referred to as a silicon interposer. In an embodiment in which the substrate 701 is an organic substrate, the interposer substrate 700 may be referred to as a panel interposer.

The lower protective layer 703 may be disposed on (e.g., disposed directly thereon in the Z direction) a lower surface of the substrate 701, and the lower pad 705 may be disposed below the lower protective layer 703 (e.g., disposed directly therebelow in the Z direction). The lower pad 705 may be connected to the through-via 730. The chip structure PS and the processor chip 800 may be electrically connected to the package substrate 900 through the metal bumps 720 disposed below the lower pad 705.

The interconnection structure 710 may be disposed on (e.g., disposed directly thereon in the Z direction) an upper surface of the substrate 701, and may include an interlayer insulating layer 711 and a single layer or multilayer interconnection structure 712. In an embodiment in which the interconnection structure 710 has a multilayer interconnection structure, interconnection patterns of different layers may be connected to each other through a contact via.

The through-via 730 may extend from the upper surface to the lower surface of the substrate 701 (e.g., in the Z direction), and may pass through the substrate 701. Also, the through-via 730 may extend into the interconnection structure 710 and be electrically connected to interconnections of the interconnection structure 710. In an embodiment in which the substrate 701 is silicon, the through-via 730 may be referred to as a TSV. In some embodiments, the interposer substrate 700 may include only the interconnection structure therein, and may not include the through-via.

In an embodiment, the interposer substrate 700 may be used for the purpose of converting or transmitting an input electrical signal between the package substrate 900 and the chip structure PS or the processor chip 800. Therefore, the interposer substrate 700 may not include devices such as an active device, a passive device, or the like. Also, according to an embodiment, the interconnection structure 710 may be disposed below the through-via 730 (e.g., in the Z direction). For example, a positional relationship between the interconnect structure 710 and the through-via 730 may be relative.

The metal bump 720 may electrically connect the interposer substrate 700 and the package substrate 900 to each other. The chip structure PS may be electrically connected to the metal bump 720 through the interconnections of the interconnection structure 710 and the through-via 730. In some embodiments, lower pads 705 used for power or grounding may be integrated, and may be connected together with the metal bumps 720, such that the number of lower pads 705 may be greater than the number of metal bumps 720. However, embodiments of the present inventive concept are not necessarily limited thereto.

In an embodiment, the processor chip 800 may include, for example, a central processor (CPU), a graphics processor (GPU), a field programmable gate array (FPGA), a digital signal processor (DSP), a cryptographic processor, a microprocessor, a microcontroller, an analog-digital converter, an application specific integrated circuit (ASIC), or the like.

According to an embodiment, the semiconductor package 1000E may further include an internal encapsulant covering the chip structure PS and the processor chip 800 on the interposer substrate 700. In addition, the semiconductor package 1000E may further include an external encapsulant covering the interposer substrate 700 and the internal encapsulant on the package substrate 900. In an embodiment, the external encapsulant and the internal encapsulant may be formed together, and may not be distinguished from each other. According to an embodiment, the semiconductor package 1000E may further include a heat dissipation structure covering the chip structure PS and the processor chip 800.

FIGS. 8A to 8F are cross-sectional views schematically illustrating a process of manufacturing a semiconductor package 1000 according to embodiments of the present inventive concept.

Figure 8A:
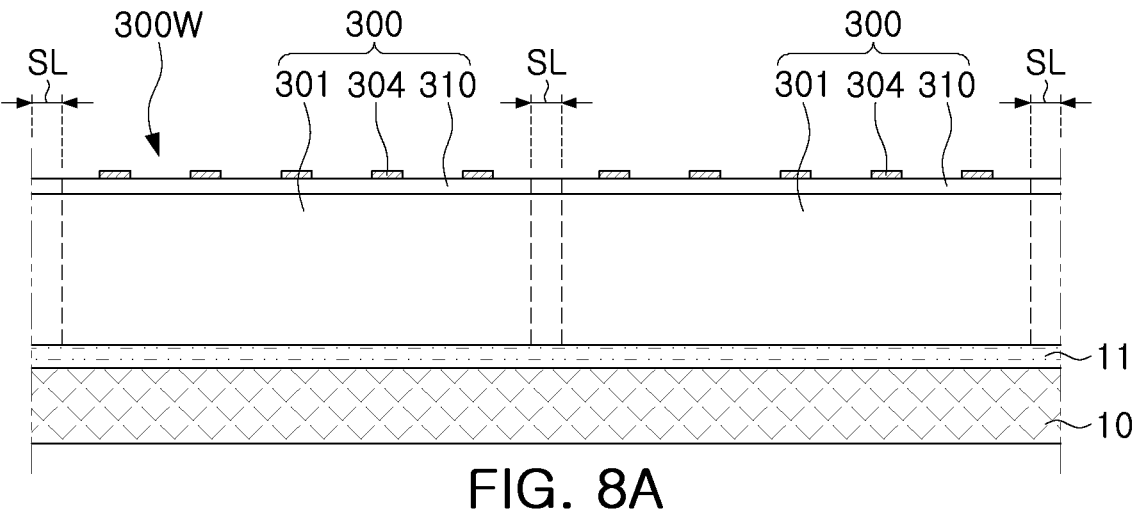
FIGS. 8A to 8F are cross-sectional views schematically illustrating a process of manufacturing a semiconductor package according to embodiments of the present inventive concept.

Referring to FIG. 8A, a semiconductor wafer 300W for a second semiconductor chip 300 may be formed. The semiconductor wafer 300W may include a plurality of second semiconductor chips 300 divided by a scribe lane SL. In an embodiment, the semiconductor wafer 300W may be attached on a carrier 10 by an adhesive layer 11. The second semiconductor chip 300 may include a device layer 310 and a lower pad 304, formed on a substrate 301.

Figure 8B:
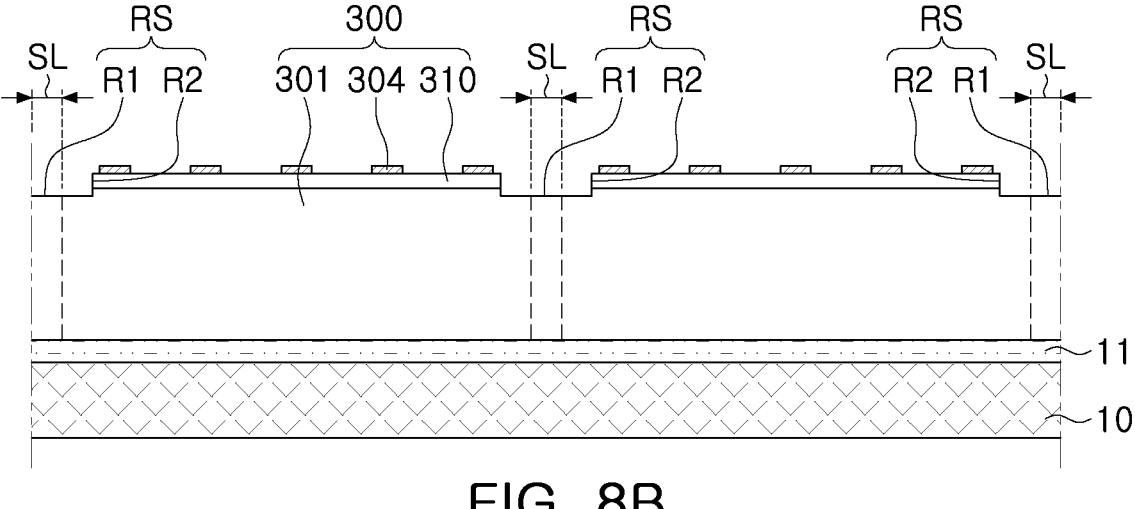

Referring to FIG. 8B, a recess surface RS may be formed between the second semiconductor chips 300 (e.g., in the X and/or Y directions). The recess surface RS may have a horizontal surface R1 extending in the horizontal direction, and a vertical surface R2 extending in the vertical direction. In an embodiment, the recess surface RS may be formed to have a width that is greater than a width of the scribe lane SL, such as by using a laser, or a blade having a wider width.

Figure 8C:
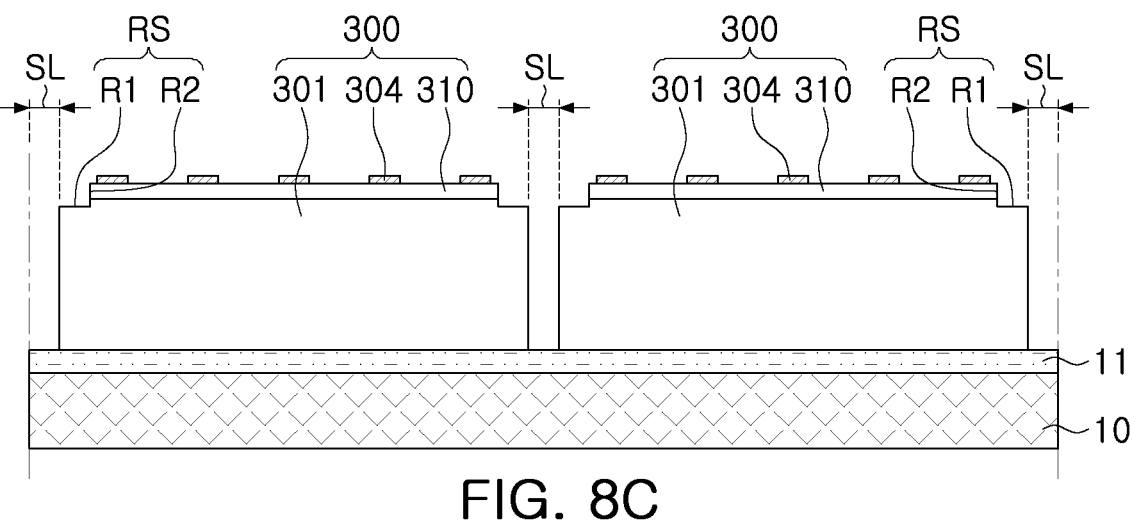

Referring to FIG. 8C, the semiconductor wafer 300W may be cut along the scribe lane SL, and the second semiconductor chips 300 may be separated from each other. In an embodiment, the semiconductor wafer 300W may be cut using a laser or a blade. The second semiconductor chips 300 may have recess surfaces RS formed on respective edges. Thereafter, the second semiconductor chips 300 may be stacked on an uppermost first semiconductor chip 200C.

Figure 8D:
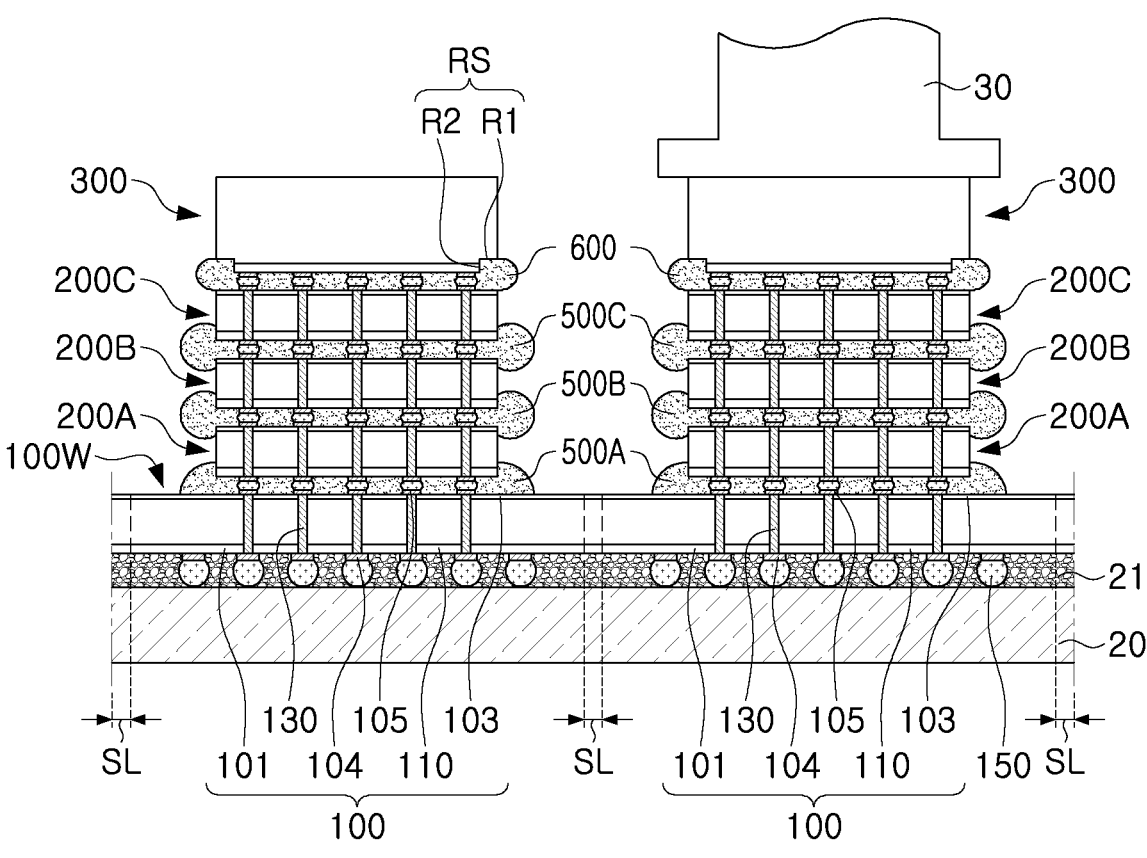

Referring to FIG. 8D, a plurality of semiconductor chips 200A, 200B, 200C, and 300 may be sequentially stacked on a wafer substrate 100W for a base chip 100. The wafer substrate 100W may include a plurality of base chips 100 divided by a scribe lane SL. In an embodiment, the wafer substrate 100W may be temporarily attached to a carrier substrate 20 by an adhesive material layer 21. The base chip 100 may include a substrate 101, an upper protective layer 103, an upper pad 105, a lower pad 104, a device layer 110, a through-electrode 130, and a connection bump 150. In an embodiment, the plurality of semiconductor chips 200A, 200B, 200C, and 300 may be mounted on the base chip 100 by performing a thermal compression bonding process. For example, the plurality of semiconductor chips 200A, 200B, 200C, and 300 may be vacuum-sucked, picked, and placed by a bonding head 30. By the thermal compression bonding process, first adhesive films 500A, 500B, and 500C and a second adhesive film 600 may have extension portions protruding further outwardly than the plurality of semiconductor chips 200A, 200B, 200C, and 300, respectively. The extension portions may cause a defect in appearance and a decrease in reliability of the semiconductor package. According to an embodiment of the present inventive concept, a size of the extension portions may be controlled by the recess surface RS of the uppermost semiconductor chip 300, to prevent the occurrence of a defect in the appearance and a decrease in reliability by the extension portions.

Figures 8E, 8F:
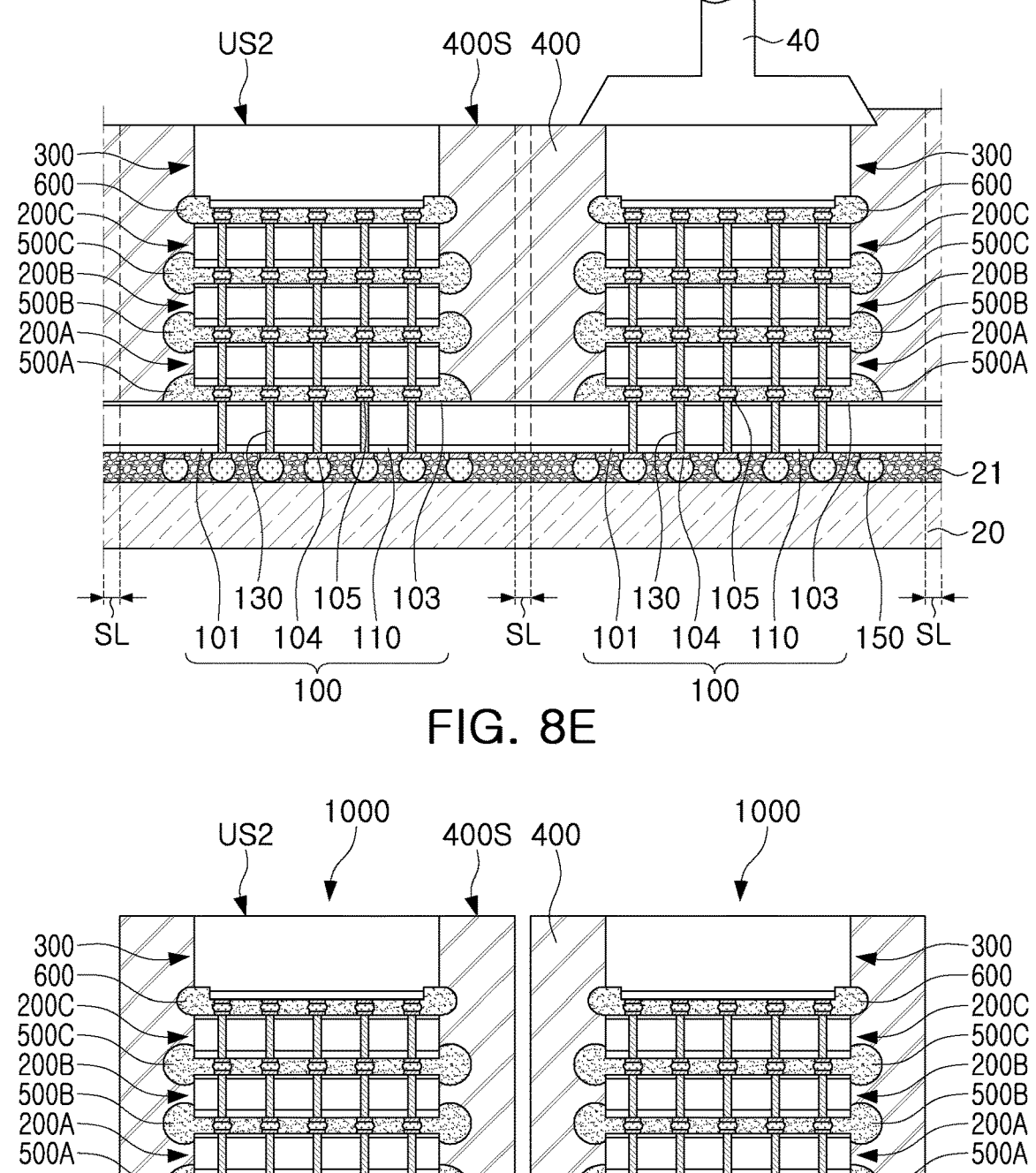

Referring to FIG. 8E, an encapsulant 400 covering the plurality of semiconductor chips 200A, 200B, 200C, and 300 may be formed, and an upper surface 400S of the encapsulant 400 may be planarized using polishing equipment 40. By the planarization process, the upper surface 400S of the encapsulant 400 may be positioned to be substantially coplanar (e.g., in the Z direction) with an upper surface US2 of an uppermost semiconductor chip 300. In an embodiment, the planarization process may be performed by, for example, a chemical mechanical polishing (CMP) process.

Referring to FIG. 8F, a plurality of semiconductor packages 1000 may be separated by cutting the encapsulant 400 and the wafer substrate 100W along a scribe lane SL. The plurality of semiconductor packages 1000 may reduce a defect in appearance and a decrease in reliability by controlling the size of the extension portion of the uppermost adhesive film 600 using the recess surface RS of the uppermost semiconductor chip 300.

According to an embodiment of the present inventive concept, a semiconductor package having increased reliability may be provided by controlling a height of an extension portion of an uppermost adhesive film.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a base chip;

a plurality of first semiconductor chips stacked on the base chip in a vertical direction, the plurality of first semiconductor chips having a first lower surface including a first front surface pad disposed thereon, a first upper surface opposing the first lower surface and including a first rear surface pad disposed thereon, and a first side surface extending from an edge of the first lower surface to an edge of the first upper surface, the first front surface pad and the first rear surface pad are electrically connected to each other by a through-via;

a second semiconductor chip disposed on the plurality of first semiconductor chips, the second semiconductor chip having a second lower surface including a second front surface pad disposed thereon, a second upper surface opposing the second lower surface, a second side surface extending from an edge of the second upper surface, and a recess surface extending from an edge of the second lower surface to an end of the second side surface, the second semiconductor chip is electrically connected to the plurality of first semiconductor chips and the base chip through the through-via;

an encapsulant disposed on the base chip, the encapsulant surrounding the plurality of first semiconductor chips and the second semiconductor chip;

a plurality of first adhesive films disposed on the first lower surface of each of the plurality of first semiconductor chips, the plurality of first adhesive films having first extension portions extending further outwardly than the first side surface of each of the plurality of first semiconductor chips;

a second adhesive film disposed on the second lower surface of the second semiconductor chip, the second adhesive film having a second extension portion extending further outwardly than the second side surface of the second semiconductor chip; and connection bumps disposed below the base chip, wherein, in a horizontal direction, a length of the second extension portion is less than a length of each of the first extension portions.

2. The semiconductor package of claim 1, wherein:

the length of each of the first extension portions is a distance from an end of each of the first extension portions to the first side surface in a direction perpendicular to the first side surface, and the length of the second extension portion is a distance from an end of the second extension portion to the second side surface in a direction perpendicular to the second side surface.

3. The semiconductor package of claim 1, wherein:

the recess surface comprises a horizontal surface extending from the end of the second side surface; and a vertical surface extending from the edge of the second lower surface to a first end of the horizontal surface.

4. The semiconductor package of claim 3, wherein the second adhesive film directly contacts at least a portion of the horizontal surface and the vertical surface.

5. The semiconductor package of claim 3, wherein, in a direction, perpendicular to the second lower surface, a first height from the second lower surface to the horizontal surface of the recess surface is greater than a second height from the first upper surface of an uppermost first semiconductor chip of the plurality of first semiconductor chips to the second lower surface.

6. The semiconductor package of claim 5, wherein:

the first height is in a range of about 30 μm to about 45 μm; and the second height is in a range of about 5 μm to about 20 μm.

7. The semiconductor package of claim 3, wherein a first distance from the second side surface to the vertical surface of the recess surface in a direction, perpendicular to the second side surface is greater than a first height from the second lower surface to the horizontal surface of the recess surface in a direction perpendicular to the second lower surface.

8. The semiconductor package of claim 7, wherein the first distance is in a range of about 50 μm to about 100 μm.

9. The semiconductor package of claim 1, wherein, in the horizontal direction, the second lower surface of the second semiconductor chip has a width that is less than a width of the first lower surface and a width of the first upper surface of each of the plurality of first semiconductor chips.

10. The semiconductor package of claim 9, wherein, in the horizontal direction, the second upper surface of the second semiconductor chip has a width that is equal to the width of the first lower surface and the width of the first upper surface of each of the plurality of first semiconductor chips.

11. The semiconductor package of claim 1, wherein a first thickness from the second lower surface to the second upper surface is greater than a second thickness from the first lower surface to the first upper surface of each of the plurality of first semiconductor chips.

12. The semiconductor package of claim 11, wherein a third thickness from the recess surface to the second upper surface is at least about 200% greater than the second thickness from the first lower surface to the first upper surface.

13. The semiconductor package of claim 1, wherein the first extension portions directly contact at least a portion of the first side surface of at least one of the plurality of first semiconductor chips.

14. The semiconductor package of claim 1, wherein the second extension portion does not directly contact the second side surface of the second semiconductor chip.

15. The semiconductor package of claim 1, wherein the second upper surface of the second semiconductor chip is coplanar with an upper surface of the encapsulant in the vertical direction.

16. A semiconductor package comprising:

a base chip;

a plurality of first semiconductor chips stacked on the base chip in a vertical direction;

a second semiconductor chip disposed on an uppermost first semiconductor chip of the plurality of first semiconductor chips, the second semiconductor chip having a lower surface facing an upper surface of the uppermost first semiconductor chip and a recess surface extending along an edge of the lower surface;

an encapsulant disposed on the base chip, the encapsulant surrounding the plurality of first semiconductor chips and the second semiconductor chip;

a plurality of first adhesive films disposed below each of the plurality of first semiconductor chips; and a second adhesive film having a central portion disposed below the second semiconductor chip, the central portion filling a space between the upper surface of the uppermost first semiconductor chip and the lower surface of the second semiconductor chip, and an edge portion filling a space between the upper surface of the uppermost first semiconductor chip and the recess surface, wherein the edge portion only overlaps the lower surface of the second semiconductor chip in a horizontal direction.

17. The semiconductor package of claim 16, wherein:

the plurality of first adhesive films have first extension portions extending further outwardly than a side surface of each of the plurality of first semiconductor chips, wherein the first extension portions overlap at least one of the plurality of first semiconductor chips in the horizontal direction.

18. The semiconductor package of claim 17, wherein the first extension portions have an inclined shape, wherein a width of a lower portion of the first extension portions adjacent to the base chip is greater than a width of an upper portion of the first extension portions.

19. The semiconductor package of claim 16, wherein:

the second adhesive film has a second extension portion extending outwardly from the edge portion, wherein the second extension portion does not overlap the plurality of first semiconductor chips in the horizontal direction.

20. A semiconductor package comprising:

a base chip;

at least one first semiconductor chip disposed on the base chip;

a second semiconductor chip disposed on the at least one first semiconductor chip, the second semiconductor chip having a lower surface facing an upper surface of the at least one first semiconductor chip and a recess surface extending along an edge of the lower surface;

an encapsulant disposed on the base chip, the encapsulant surrounding the at least one first semiconductor chip and the second semiconductor chip;

at least one first adhesive film disposed below the at least one first semiconductor chip, the at least one first adhesive film having a first central portion overlapping the at least one first semiconductor chip in a vertical direction, and an extension portion extending from the first central portion, the extension portion protrudes in a horizontal direction from an outermost side of the at least one first semiconductor chip; and a second adhesive film disposed below the second semiconductor chip, and having a second central portion overlapping the lower surface of the second semiconductor chip in the vertical direction, and an edge portion extending from the second central portion and overlapping the recess surface of the second semiconductor chip in the vertical direction, wherein, in the horizontal direction, a first width of the first central portion is greater than a second width of the second central portion.

\* \* \* \* \*